United States Patent [19]
Mihara et al.

[11] Patent Number: 5,681,780
[45] Date of Patent: Oct. 28, 1997

[54] MANUFACTURE OF SEMICONDUCTOR DEVICE WITH ASHING AND ETCHING

[75] Inventors: Satoru Mihara; Keisuke Shinagawa, both of Kawasaki; Tatsuya Takeuchi, Kobe, all of Japan

[73] Assignee: Fujitsu Limited, Kawasaki, Japan

[21] Appl. No.: 410,515

[22] Filed: Mar. 24, 1995

[30] Foreign Application Priority Data

May 23, 1994 [JP] Japan .................................. 6-108508
Aug. 24, 1994 [JP] Japan .................................. 6-199639

[51] Int. Cl.⁶ ................................................ H01L 21/306
[52] U.S. Cl. ...................... 437/228; 437/229; 430/316; 430/330; 156/643.1; 156/653.1; 156/659.11
[58] Field of Search ........................... 430/316, 330; 156/643.1, 653.1, 657.1, 659.11, 662.1; 437/228, 229

[56] References Cited

U.S. PATENT DOCUMENTS

| | | | |
|---|---|---|---|
| 4,292,384 | 9/1981 | Straughan et al. | 430/5 |
| 4,814,041 | 3/1989 | Auda | 156/643.1 |
| 4,861,424 | 8/1989 | Fujimura et al. | 156/643.1 |
| 5,057,187 | 10/1991 | Shinagawa et al. | 156/643.1 |
| 5,099,100 | 3/1992 | Bersin et al. | 219/121.4 |
| 5,164,034 | 11/1992 | Arai et al. | 156/345 |

*Primary Examiner*—John A. McPherson
*Attorney, Agent, or Firm*—Armstrong, Westerman, Hattori, McLeland & Naughton

[57] ABSTRACT

A method of manufacturing a semiconductor device including the steps of: forming an insulating film on a silicon substrate; forming a resist pattern on the insulating film; etching the insulating film by using the resist pattern as an etching mask to expose a surface of the silicon substrate; and ashing the resist pattern and etching a surface layer at the exposed surface of the silicon substrate at the same time. The ashing/etching step may be performed first at a high temperature at or above 40° C. and then at a lower temperature.

21 Claims, 17 Drawing Sheets

MANUFACTURE OF SEMICONDUCTOR DEVICE WITH ASHING AND ETCHING

BACKGROUND OF THE INVENTION

1. Field of the Invention

The present invention relates to a method of manufacturing a semiconductor device, and more particularly to a method of manufacturing a semiconductor device including the step of forming a contact hole passing through an insulating film and reaching the surface of a semiconductor substrate.

2. Description of the Related Art

A wiring is formed over a semiconductor substrate made of Si or other semiconductors after active regions such as transistors and resistors are formed in the semiconductor substrate. In the general case, the surface of the semiconductor substrate is covered with an insulating film, a contact hole is formed in the insulating film so as to reach the electrode contact area of the active region, and a wiring layer is formed on the insulating film.

In forming a contact hole, a resist pattern is generally formed on the insulating film, and the insulating film is etched by using the resist pattern as an etching mask. Anisotropic etching such as reactive ion etching (RIE) using fluorocarbon gas such as $CF_4+CHF_3$ is often used in order to form a contact hole of highly precise size.

After the contact hole is formed, the unnecessary resist is removed, for example, by ashing with oxygen containing plasma. If dry etching and ashing processes are used, a good process performance is ensured because both the processes are dry process.

When a contact hole is formed by dry etching, a thin damaged layer of about several nm is formed on the exposed surface of a semiconductor substrate by plasma exposure. If a wiring layer contacts the damaged layer, a contact resistance increases, or other objectionable effects may occur. It is therefore desired to remove the damaged layer.

Prior to the ashing process, light etching is therefore performed in order to remove the semiconductor damaged layer on the surface of the semiconductor substrate. Although light etching removes the damaged layer, it is desired that light etching etches the insulating film as less as possible so as not to change the size of the contact hole. Light etching is generally performed by plasma down-flow etching by using mixed gas of $CF_4$ and $O_2$. The resist pattern is not removed by this plasma down-flow etching because the surface thereof has been fluorinated by RIE of the insulating film. The ashing process as well as the etching process for the damaged layer is therefore necessary.

As described above, if a contact hole is formed by etching an insulating film on a semiconductor substrate with fluorine containing gas and by using a resist pattern as an etching mask, a damaged layer is formed on the semiconductor surface. It has been necessary to remove the damaged layer and resist pattern by different processes.

SUMMARY OF THE INVENTION

It is an object of the present invention to provide a method of manufacturing a semiconductor device, the method having simplified processes including the process of patterning an insulating film and forming a contact hole.

It is another object of the present invention to provide a method of manufacturing a semiconductor device capable of forming a good contact by efficiently removing a damaged layer on the semiconductor surface and a resist pattern on an insulating film after a contact hole is formed in the insulating film.

According to one aspect of the present invention, there is provided a method of manufacturing a semiconductor device including the steps of: forming an insulating film on a silicon substrate; forming a resist pattern on the insulating film; etching the insulating film by using the resist pattern as an etching mask to expose the surface of the silicon substrate; and ashing the resist pattern and etching an exposed surface layer of the silicon substrate at the same time.

According to another aspect of the present invention, there is provided a method of manufacturing a semiconductor device including the steps of: forming an insulating film on a silicon substrate; coating a resist film on the insulating film and exposing and developing the resist film to form a resist pattern; etching the insulating film by using the resist pattern as a mask to form a contact hole; partially ashing the resist pattern by raising a temperature of the substrate to 50° C. or higher; and wholly ashing the resist pattern and etching a silicon surface layer at the bottom of the contact hole at the same time after the substrate temperature is lowered to 30° C. or lower.

According to still another aspect of the present invention, there is provided a method of manufacturing a semiconductor device including the steps of: forming an insulating film on a silicon substrate; coating a resist film on the insulating film, exposing and developing the resist film to form a resist pattern; etching the insulating film by using the resist pattern as a mask to form a contact hole; etching a silicon surface layer at the bottom of the contact hole while maintaining a silicon substrate temperature at 30° C. or lower; and thereafter raising the silicon substrate temperature to 50° C. or higher and ashing the resist pattern.

The surface of resist is changed in quality after an etching process using fluorine containing gas such as fluorocarbon, and the changed surface layer cannot be removed by usual ashing.

However, if the substrate is heated to 40° C. or higher and ashing/etching is performed using gas containing oxygen and fluorine, the changed resist surface layer can be removed.

The manufacturing processes for a semiconductor device can be simplified by ashing a resist pattern used for forming a contact hole and etching the damaged layer on the silicon substrate surface at the same time. A good contact can be obtained because the damaged layer is removed at the same time when ashing is performed.

For example, gas containing $O_2$ and $CF_4$ may be used. The temperature is preferably heated in the range from 50° to 200° C. As the temperature is raised to 50° C. or higher, an ashing start delay time of removing a changed layer becomes small. If the temperature is raised to 200° C. or higher, contamination by a resist layer becomes a problem.

In the case of mixed gas of $CF_4+O_2$, a selectivity ratio of resist ashing to $SiO_2$ etching can be raised by setting a ratio of $CF_4$ flow rate to the total flow rate to about 1 to 8 volume %, or preferably to about 2.5 to 5 volume %.

After the changed resist layer is removed at the temperature of 50° C. or higher, the remaining ashing/etching process can be performed at a lower temperature. The selectivity ratio of resist ashing to $SiO_2$ etching can also be raised by lowering the temperature. If an insulating film is a laminate of two or more layers having different etching characteristics, a good pattern is ensured by raising an etching ratio of Si to the insulating film. It is also possible to facilitate an etching control by exchanging gases. For example, etching is not performed although ashing is performed if $O_2+N_2$ or $O_2+H_2O$ is used.

A silicon surface layer can be etched selectively at the temperature of 30° C. or lower. If the substrate temperature is raised to 50° C. or higher after the silicon surface layer is etched, both the changed resist layer and the resist layer can be selectivity etched with an enhanced selection ratio to silicon and the insulating film.

DETAILED DESCRIPTION OF THE PREFERRED EMBODIMENTS

The conventional technology will be first explained briefly prior to giving the description of the embodiments of the invention.

Figure 4A:
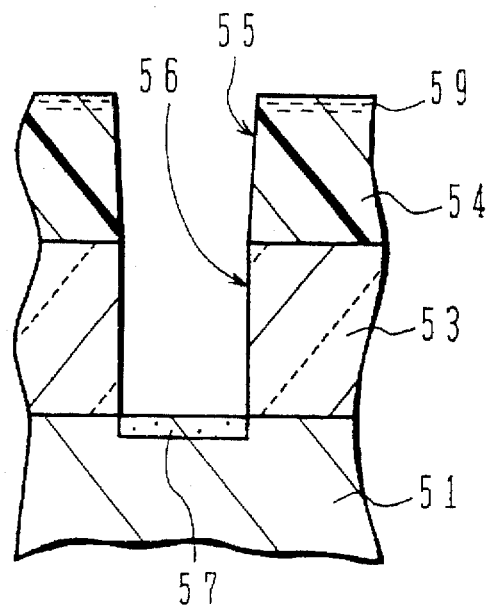
FIGS. 4A and 4B are schematic cross sectional views explaining the process of forming a contact hole according to a prior art.

As shown in FIG. 4A, an $SiO_2$ film 53 is formed on an Si substrate 51. A resist film 54 is coated on the insulating film 53, and developed and exposed to form an opening 54 for a contact hole. By using the resist film 54 with the opening 55 as an etching mask, a contact hole 56 is formed in the insulating film 53 by reactive ion etching (RIE) using fluorine containing gas such as $CF_4+CHF_3$.

When the contact hole 56 is formed by RIE, the surface of the Si substrate 51 is exposed to plasma and a surface damaged layer 57 is formed. If electrical contact is made without removing the damaged layer 57, the electrical characteristics of contact are deteriorated.

A dry process is performed under the following conditions, trying to remove the damaged layer 57 and resist film 54 at the same time.

| | |
|---|---|
| $O_2$ flow rate | 800 sccm |
| $CF_4$ flow rate | 200 sccm |
| Pressure | 1.0 torr |
| Microwave power | 1.5 kW |
| Wafer temperature | 25° C. |

$O_2$ is a composition necessary for ashing the resist layer 54, and $CF_4$ is a composition necessary for removing the damaged layer 57 on the Si substrate 51.

Figure 4B:
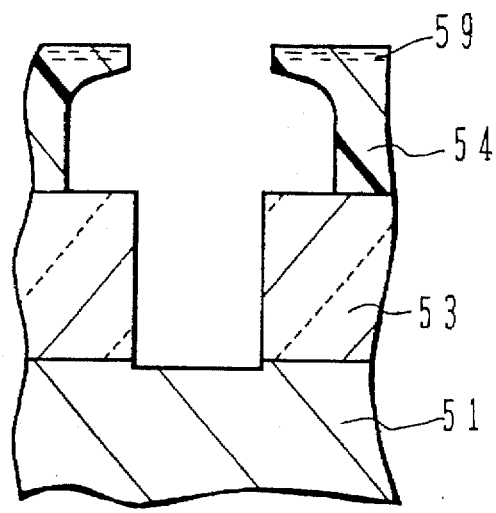

FIG. 4B is a schematic cross sectional view of a wafer after such a dry process. The damaged layer 57 on the surface of the Si substrate was removed. Although the resist film 54 at the side wall of the opening 55 was removed by ashing, the surface layer 59 of the resist film 54 was left without being ashed. The reason why the surface layer 59 of the resist film 54 is left, can be ascribed that the surface of the resist film 54 is fluorinated when the insulating film 54 is subjected to RIE. Since the resist film at the side wall of the opening 55 was removed by ashing, if there were no surface layer 59, the resist film 54 could be wholly removed. However, because of the presence of the fluorinated surface layer 59, it can be considered that the damaged layer 57 and resist mask 54 cannot be removed at the same time.

The inventor has conducted various studies and experiments in order to find the dry process conditions capable of removing a damaged layer on the surface of an Si substrate and ashing a resist pattern at the same time. It has been found that both a resist film with a fluorinated surface layer and a damaged layer on the surface of an Si substrate can be removed under certain conditions by raising the temperature of the wafer.

The following description is directed to the experiment results on which the present invention is based. In order to perform ashing of a resist film and light etching of a damaged layer, it is necessary to remove a thick resist film at high speed, and at the same time to remove a thin damaged layer of about several nm on an Si surface.

In order to maintain a size allowance of a contact hole, it is desired to set an etching rate of an insulating film as low as possible and to suppress broadening the contact hole. In other words, it is desired that the resist film and the Si damaged layer can be removed at the same time and that the etching selectivity ratios of a resist film to Si and of the resist film to an insulating film such as $SiO_2$ are high.

As described above, the etching (ashing) performance of a resist film changes with whether or not the film was exposed to fluorine containing plasma. From this viewpoint, there were prepared samples of Si substrates each being formed with an $SiO_2$ film of about 1 µm coated with a resist film, and similar samples each being formed with an $SiO_2$ film having been subjected to RIE in a parallel plate type RIE system by using a resist pattern as an etching mask. The RIE conditions were as follows.

| | |
|---|---|
| $CF_4$ flow rate | 50 sccm |
| $CHF_3$ flow rate | 50 sccm |
| Pressure | 0.1 torr |
| RF power | 1.0 kW |
| Wafer temperature | 20° C. |

Ashing was performed for the samples underwent an RIE process and for the samples without the RIE process under the following conditions.

| | |
|---|---|
| O$_2$ flow rate | 950 sccm |
| CF$_4$ flow rate | 50 sccm |
| Pressure | 1.0 torr |
| Microwave power | 1.4 kW |
| Wafer temperature | 25, 50, 80, 100° C |

FIGS. 5 to 8 are graphs explaining the ashing of resist films by a dry process under the above conditions at substrate temperatures of 25°, 50°, 80°, and 100° C. In each graph, the abscissa represents time and the ordinate represents an ashing amount in μm.

Figure 5:
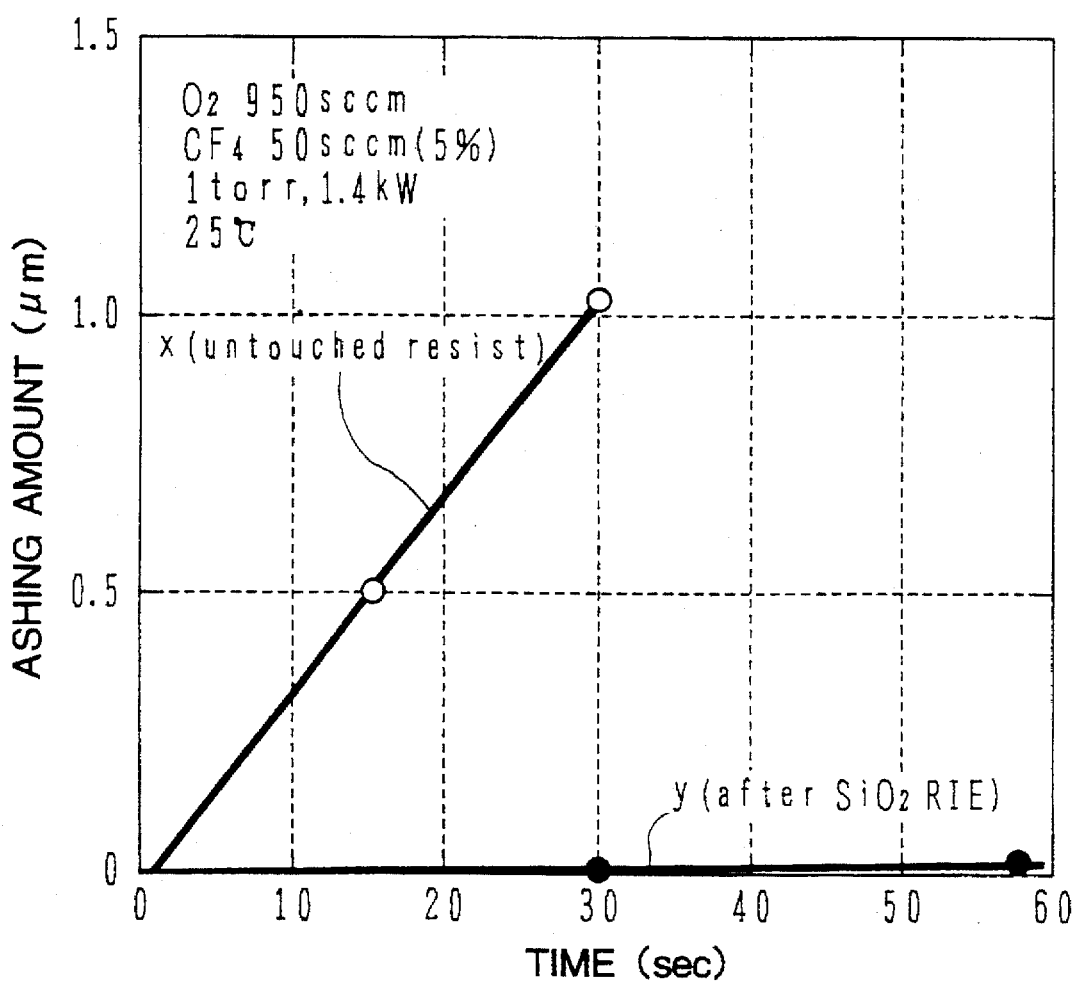
FIGS. 5 to 8 are graphs showing the experiment results of ashing.

The graph of FIG. 5 shows the experiment results at a substrate temperature of 25° C. A line x shows the experiment results of the sample without plasma exposure by RIE (untouched resist). The resist film is gradually ashed as the time lapses. Another line y shows the experiment results of the sample with plasma exposure by RIE. The film thickness is hardly thinned, which indicates no ashing. The data of this graph of FIG. 5 corresponds to the conventional technology that a fluorinated resist film surface cannot be removed by mixed gas of O$_2$ and CF$_4$.

Figure 6:
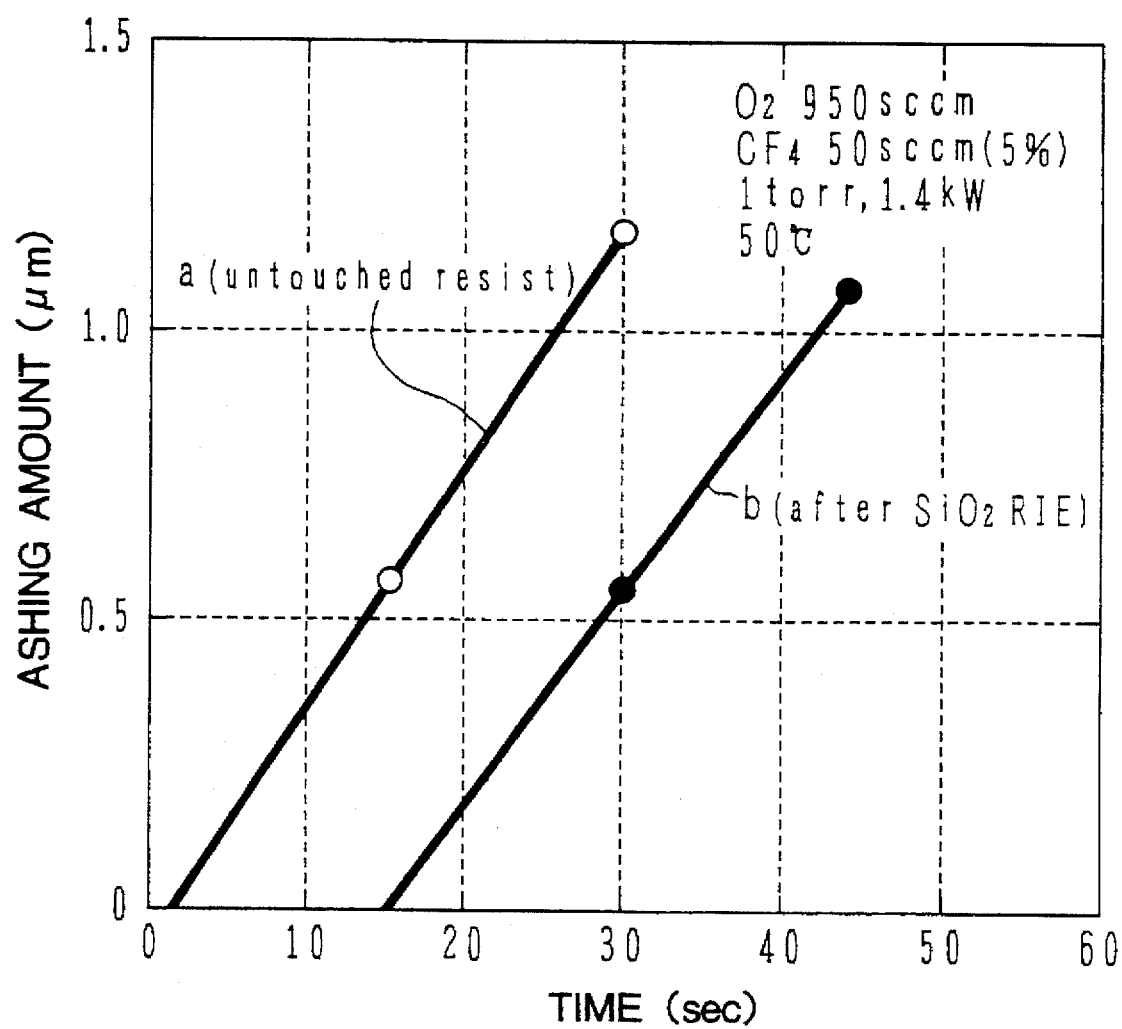
Figure 7:
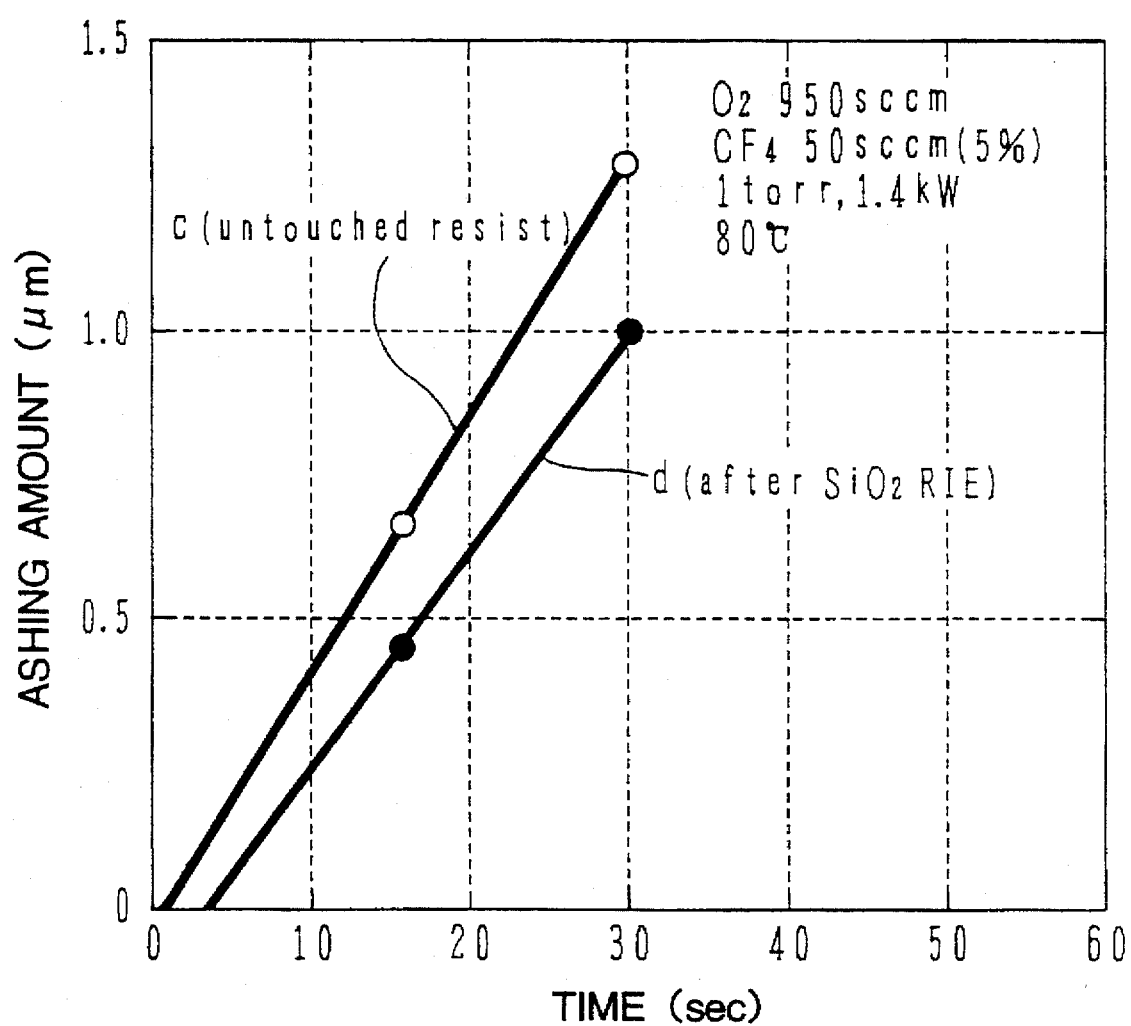
Figure 8:
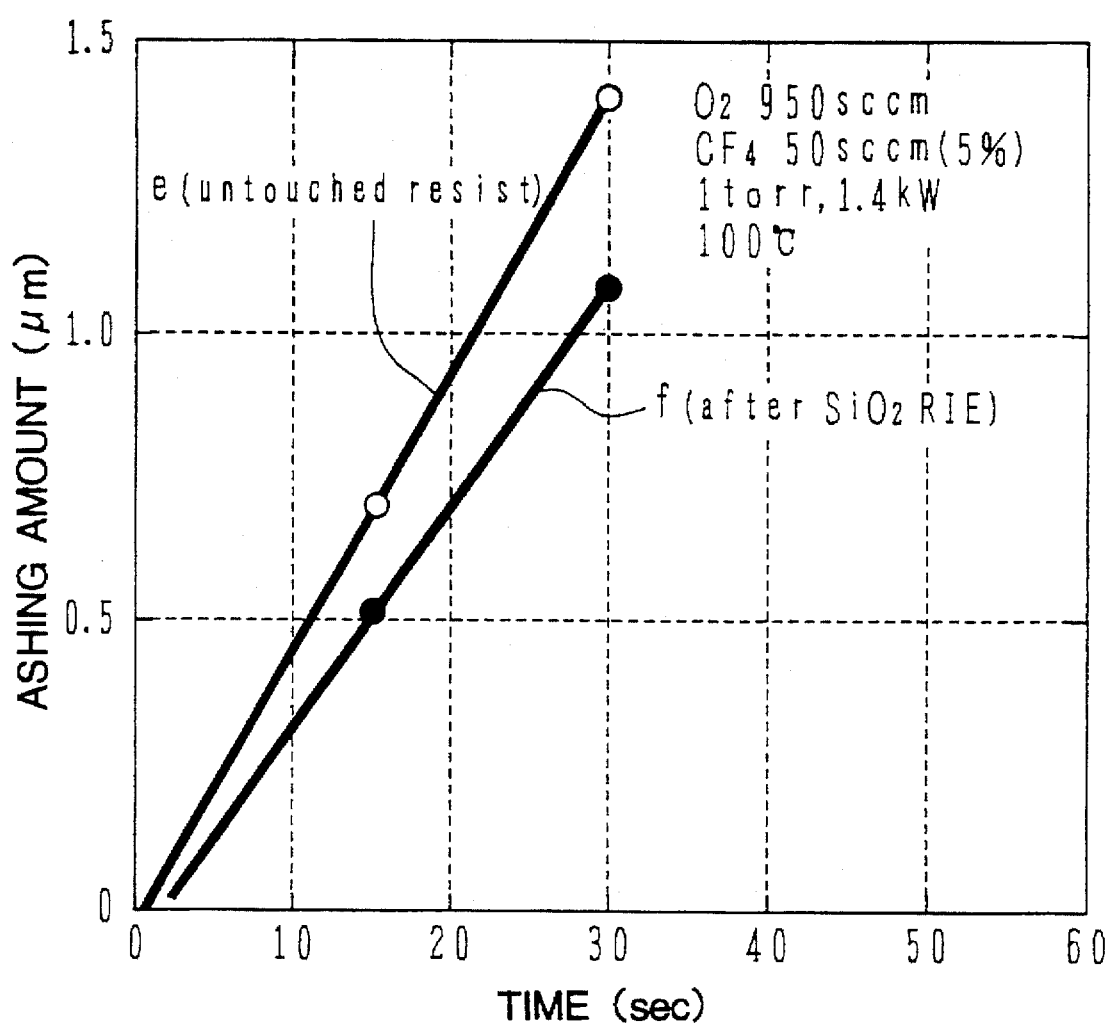

The experiment results shown in the graphs of FIGS. 6 to 8 indicate that both the samples without plasma exposure (lines a, c, and e) and the samples with plasma exposure (lines b, d, and f) can be ashed.

The graph of FIG. 6 shows the experiment results at a substrate temperature of 50° C. The characteristics b of the sample with plasma exposure rise later by a delay of about 15 seconds than the characteristics of the sample without plasma exposure, and thereafter the former sample is ashed at an ashing rate generally the same as the latter sample.

The graph of FIG. 7 shows the experiment results at a substrate temperature of 80° C. Both the sample c without plasma exposure and the sample d with plasma exposure can be ashed. Although the rising start of the sample d with plasma exposure is delayed, its delay time is very small as compared to the substrate temperature of 50° C.

The delay time is about 2 to 3 seconds as measured from the graph and about ⅕ or less of 15 seconds of the substrate temperature of 50° C. Although the ashing rate d of the sample with plasma exposure is slightly lower than the ashing rate c of the sample without plasma exposure, the tendency of the ashing rate is similar to that shown in FIG. 6.

The graph of FIG. 8 shows the experiment results at a substrate temperature of 100° C. The characteristics of the sample e without plasma exposure become more like the characteristics of the sample f with plasma exposure. The delay time of the rising start of the ashing f of the sample with plasma exposure is perhaps about 1 to 2 seconds.

A delay time of the rising start of ashing a resist film with plasma exposure has been described above. Ashing a resist film is completed when a predetermined thickness is ashed. Assuming that the thickness of a resist film is 1.0 μm, a delay time of the end of ashing a resist film with plasma exposure from the end of ashing a resist film without plasma exposure is about 16 to 17 seconds in FIG. 6, about 7 seconds in FIG. 7, and about 6 seconds in FIG. 8.

The experiment results shown in FIGS. 6 to 8 indicate that after the fluorinated surface layer of a resist film is removed, the ashing progresses in generally the similar manner as the resist film without plasma exposure.

As seen from FIGS. 6 to 8, the resist film with plasma exposure can be ashed by raising the substrate temperature. It is to be noted that the resist film with plasma exposure can't be ashed at a room temperature (25° C.). In order to ash the resist film with plasma exposure, the substrate temperature is supposedly required to be raised to at least 40° C. or higher. It is preferable to heat the substrate to at least 50° C. or higher when a delay time of the ashing start is taken into consideration.

A decomposed, cured layer on the surface of a resist film made of novolak resist for g-line and i-line of a mercury lamp was checked. It has been found from X-ray photoelectron spectroscopy that such a surface layer is formed mainly by CF$_x$. Resist forming such a surface layer is not limited to novolak resist, but other resist materials such as chemically amplified resist may also form such a surface layer. It is conceivable that RIE of an insulating film by fluorine containing gas forms the cured surface layer.

From the experiment results shown in FIGS. 6 and 7, it has been found that the resist film with plasma exposure can be ashed by raising the substrate temperature. It is desired that the above process conditions can remove a damaged layer on the surface of an Si substrate and don't etch the insulating film at the side wall of a contact hole as much as possible.

Figure 9:
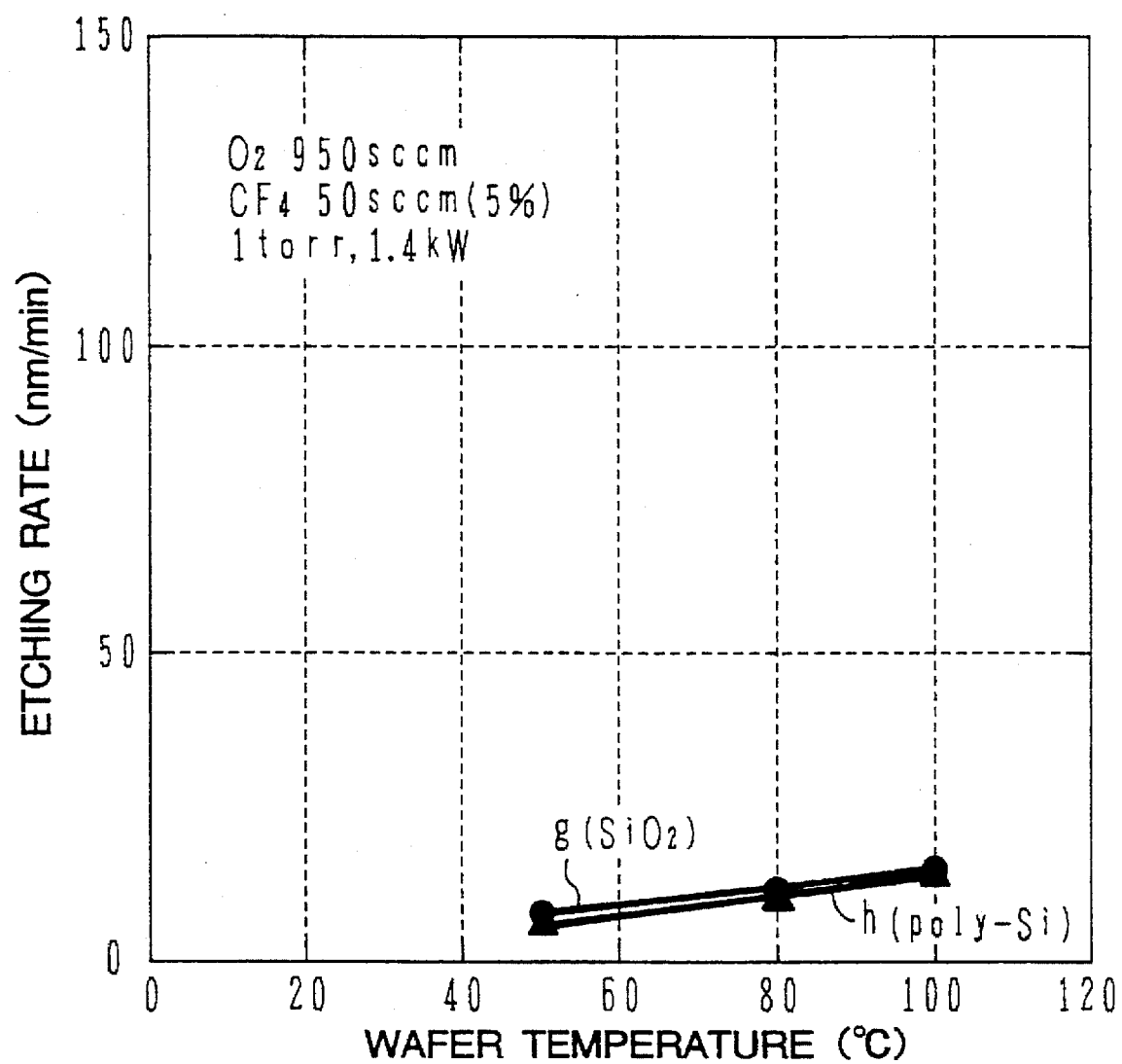
FIG. 9 is a graph showing the etching rate of other materials during ashing.

FIG. 9 shows the results of measurement of the etching rates of polycrystalline Si and SiO$_2$ under the above process conditions. The abscissa represents a wafer temperature in °C., and the ordinate represents an etching rate in nm/min. Samples used were not subjected to plasma exposure.

As the temperature rises, the etching rate h of polycrystalline Si gradually increases in the temperature range from 50° C. to 100° C., and is in the order of several nm/min to ten and several nm/min. This etching speed is suitable for removing a damaged layer on the surface of an Si substrate, because the damaged layer has a thickness of about several nm.

The etching rate g of SiO$_2$ also gradually increases in the temperature range from 50° C. to 100° C., and has generally the same value as polycrystalline Si. More precisely, the etching rate of SiO$_2$ is faster than that of polycrystalline Si at a relatively low temperature of 50° C., and a difference between the etching rates becomes small as the temperature rises.

Figure 10:
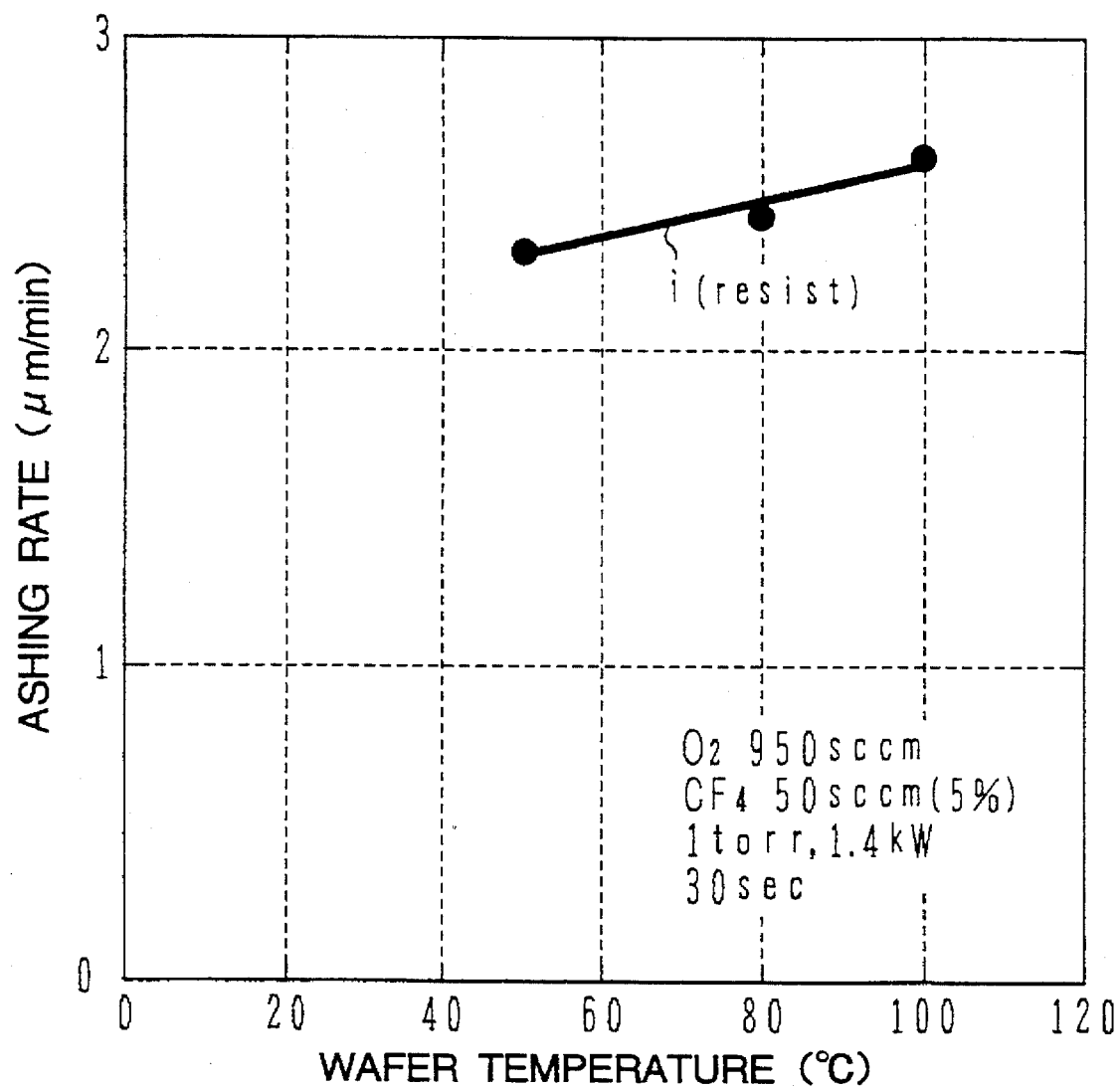
FIG. 10 is a graph showing the temperature dependency of an ashing rate.

The graph of FIG. 10 shows a change in an ashing rate of a resist film without plasma exposure, by using a wafer temperature as a parameter. The process conditions are the same as above, and the process time is 30 seconds. The abscissa represents a wafer temperature in °C., and the ordinate represents an ashing rate in μm/min. As the temperature rises, the etching rate i of the resist film gradually increases in the temperature range from 50° C. to 100° C. In this temperature range, the ashing rate is 2 μm/min or higher and a resist film of about 1 μm can be fully ashed in 30 seconds.

From the experiment results shown in FIGS. 9 and 10, the etching selectivity ratios of a resist film to polycrystalline silicon and SiO$_2$ were calculated.

Figure 11:
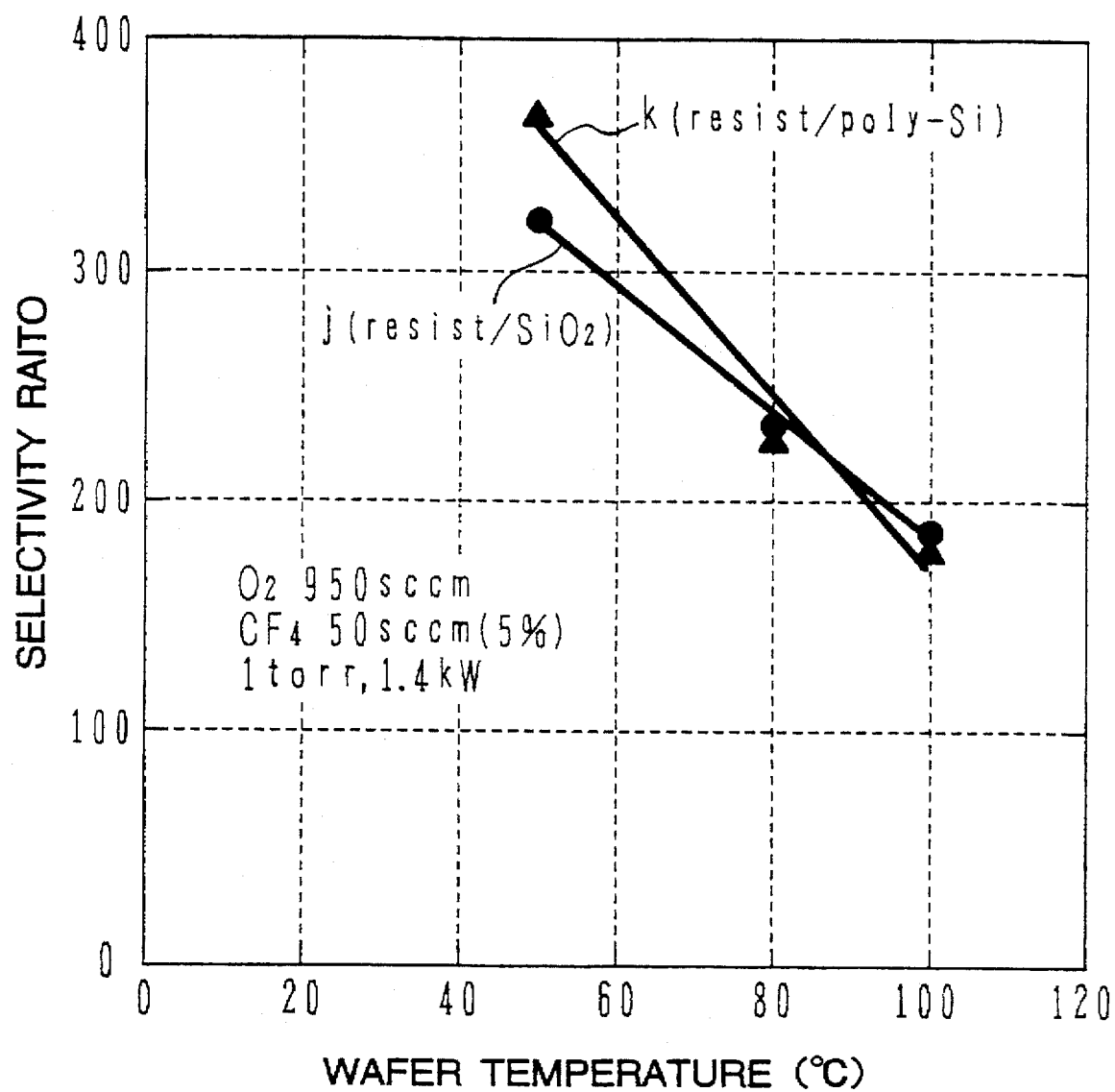
FIGS. 11 is a graph showing the temperature dependency of a selectivity ratio of ashing to etching.

FIG. 11 is a graph showing an etching selectivity ratio. The abscissa represents a wafer temperature in °C., and the ordinate represents a selectivity ratio in the term of etching (ashing) rate ratio. As the temperature rises, both the selectivity ratio j of a resist film to SiO$_2$ and the selectivity ratio k of a resist film to polycrystalline Si decrease in the temperature range from 50° C. to 100° C.

The selectivity ratio k of resist ashing to polycrystalline Si etching is higher than the selectivity ratio k of resist ashing to $SiO_2$ etching at 50° C. This relationship is inverted at a temperature of 100° C. A lower process temperature is preferable because it is desired that a resist film is ashed and $SiO_2$ is not etched.

The selectivity ratio of a resist film to Si changes with the thickness of a surface damaged layer to be removed. It is understood that if proper conditions are set, while Si is etched by a necessary thickness, a resist film can be ashed by a necessary thickness.

The above-described experiment results were obtained when the concentration of $CF_4$ in the mixed gas of $O_2$ and $CF_4$ was set to 5 volume %. The etching (ashing) performance changes with the $CF_4$ concentration.

Figure 12:
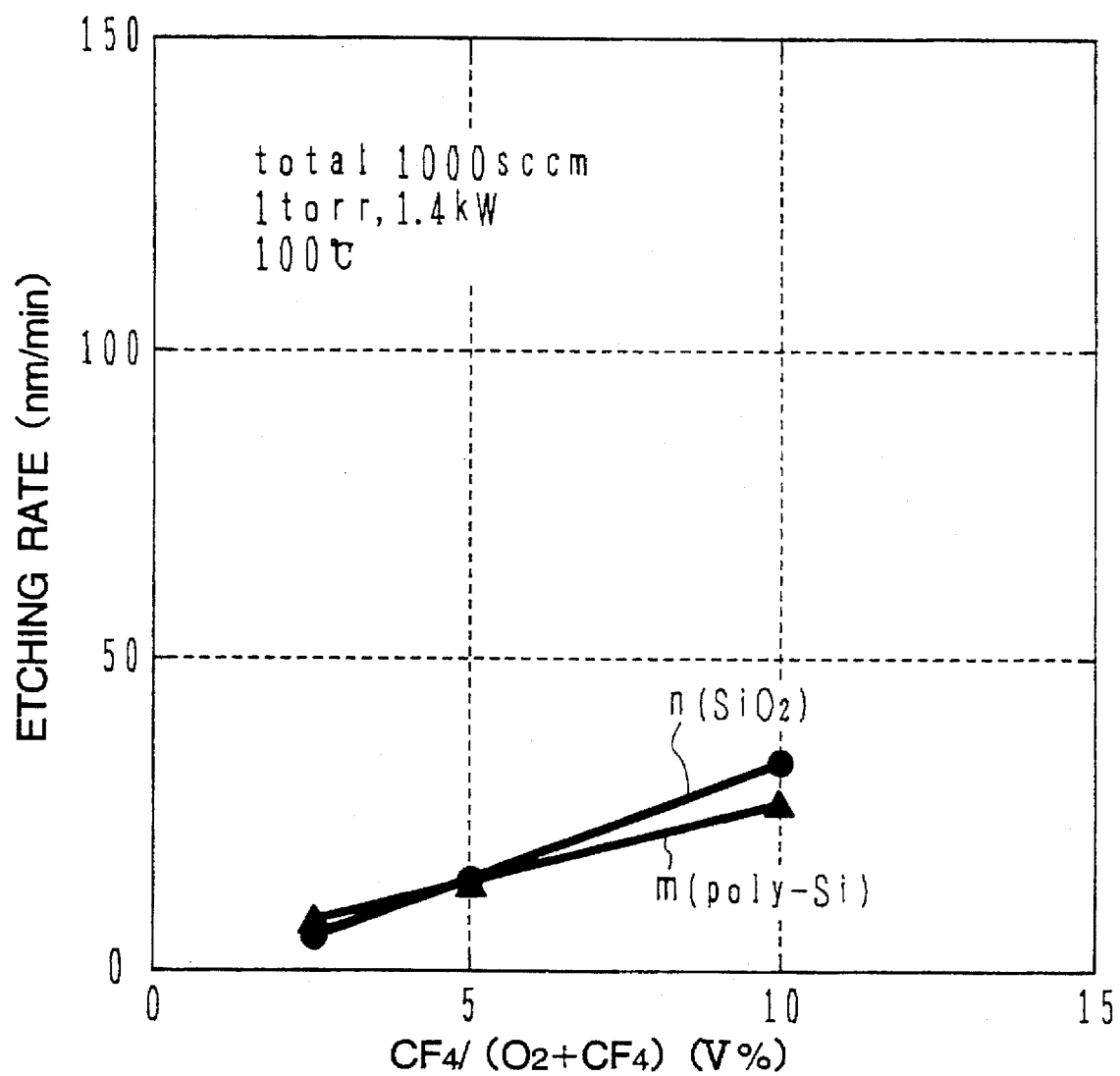
FIG. 12 is a graph showing the $CF_4$ concentration dependency of an etching rate.

FIG. 12 is a graph showing a change in the etching rate of polycrystalline Si and $SiO_2$, by using as a parameter the concentration of $CF_4$ in the mixed gas of $O_2$ and $CF_4$. The abscissa represents the concentration of $CF_4$ in volume %, and the ordinate represents the etching rate in nm/min. The experiments were performed under the conditions of a total gas flow rate of 1000 sccm, a pressure of 1 torr, a microwave ($\mu$ wave) power of 1.4 kW, and a wafer temperature of 100° C.

The $CF_4$ concentration was changed from 2.5 volume % to 10 volume %. The etching rate m of polycrystalline Si increases from about 7 nm/min to about 25 nm/min as the $CF_4$ concentration increases. The etching rate n of $SiO_2$ increases from about 5 nm/min to about 33 nm/min as the $CF_4$ concentration increases.

Figure 13:
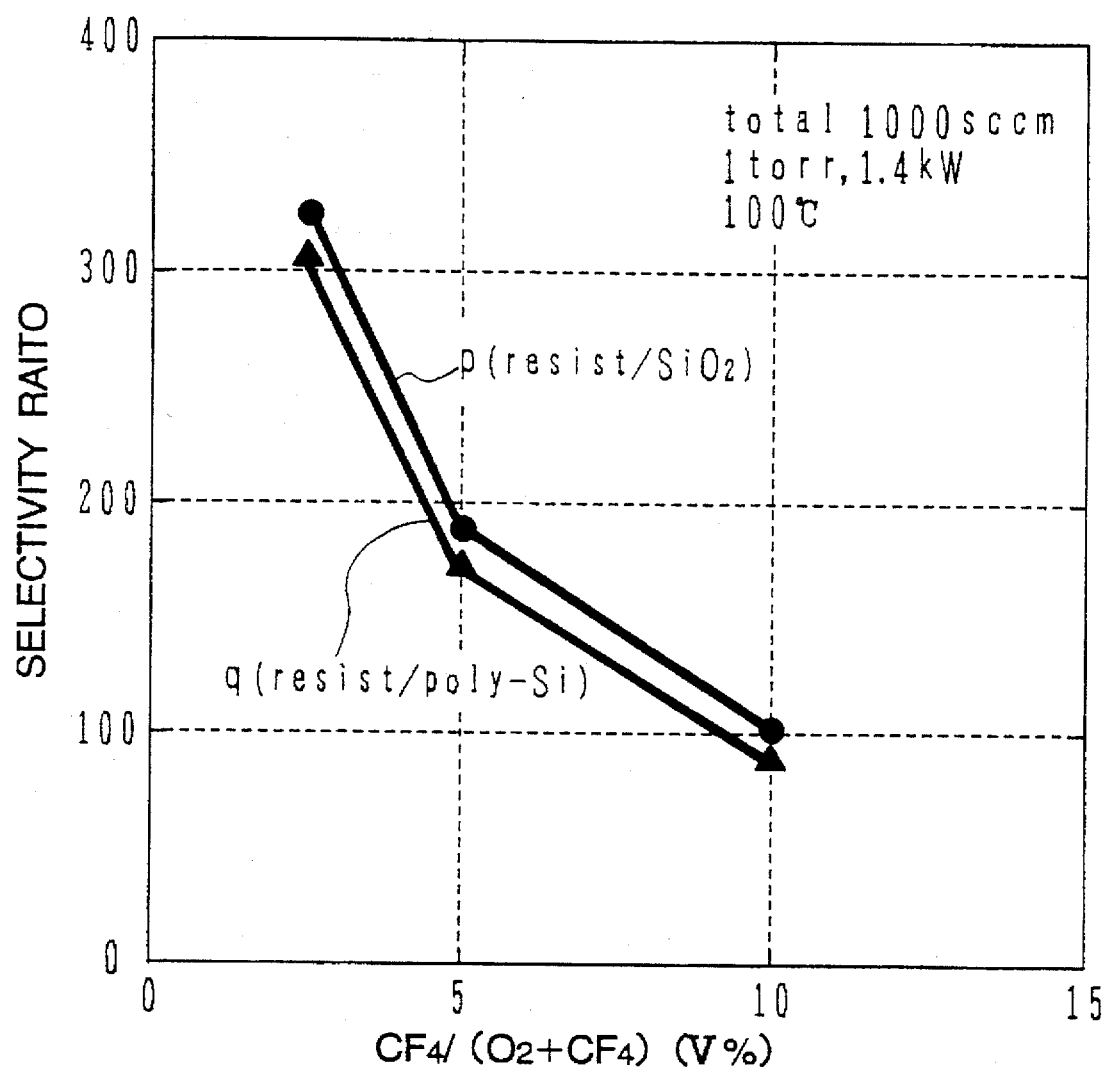
FIG. 13 is a graph showing the $CF_4$ concentration dependency of a selectivity ratio of ashing to etching.

FIG. 13 is a graph showing a change in the etching selectivity ratio under the same conditions as FIG. 12, by using as a parameter the $CF_4$ concentration. The wafer temperature was set to 100° C. The abscissa represents the $CF_4$ concentration in volume %, and the ordinate represents the selectivity ratio. The selectivity ratio q of resist to polycrystalline Si abruptly lowers from about 300 to about a little less than 100 in the range from 2.5 volume % to 10 volume % as the $CF_4$ concentration increases. Similarly, the selectivity ratio p of resist to $SiO_2$ abruptly lowers from about 330 to about 100 as the $CF_4$ concentration increases from 2.5 volume % to 10 volume %.

When it is considered that a resist film to be ashed has generally a thickness of about 1 μm and a damaged layer on the Si substrate surface to be removed has generally a thickness of about several nm, the Si surface is excessively etched if the selectivity ratio is too low. For example, a selectivity ratio of 100 may be too low under some conditions.

A selectivity ratio is preferable about 150 or higher. As the RIE technique advances, the depth of a damaged layer possibly becomes shallow so that a high selectivity ratio is expected. However, if Si can't be etched at all, the damaged layer can't be removed. If mixed gas of $O_2+CF_4$ is used, the $CF_4$ concentration is preferably in the range from about 1 to 8 volume % when other parameters such as temperature are taken into consideration.

Figure 14:
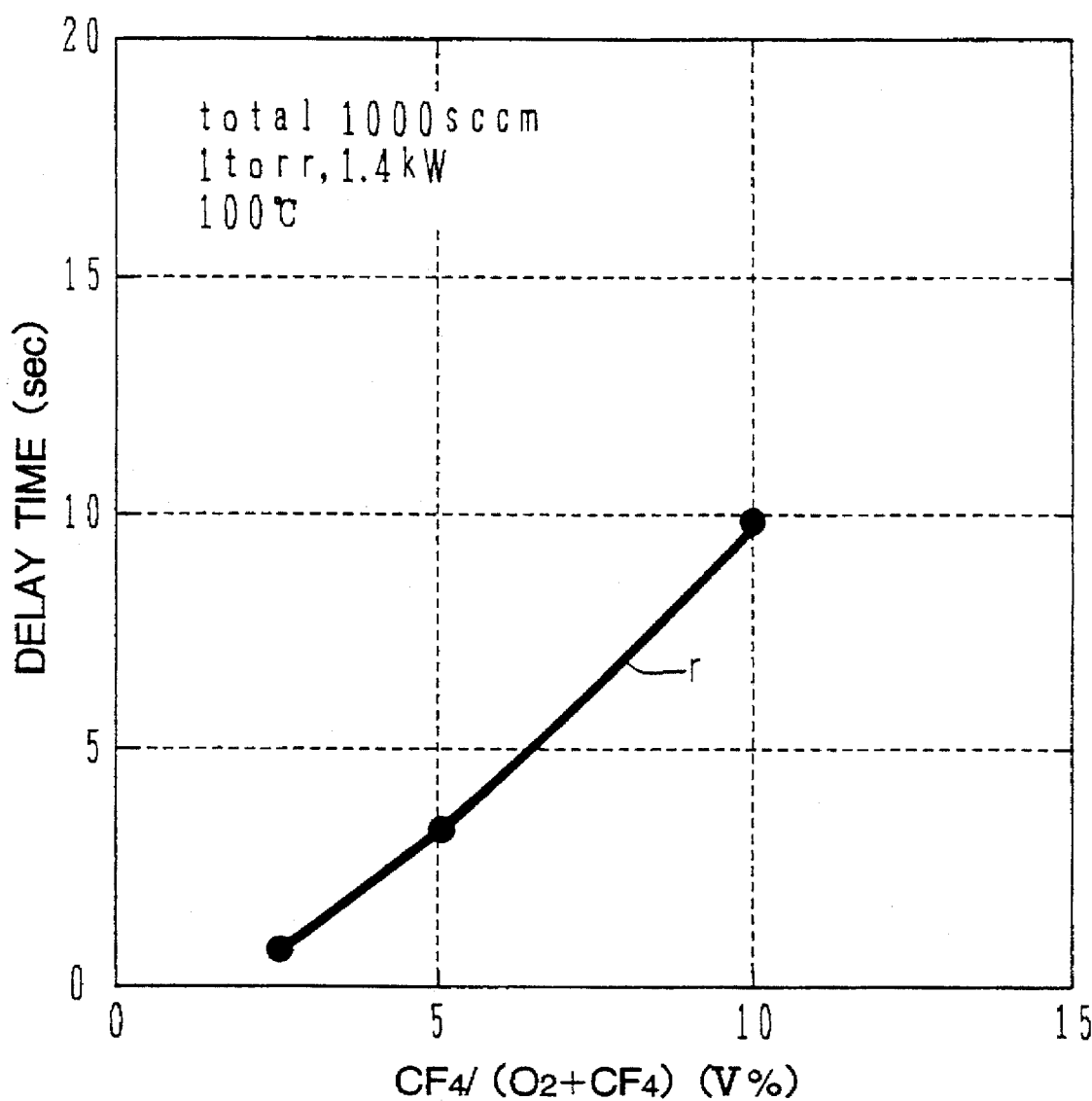
FIG. 14 is a graph showing the $CF_4$ concentration dependency of an ashing start delay time.

FIG. 14 is a graph showing a change in a delay time, by using as a parameter the concentration of $CF_4$ in the mixed gas of $O_2+CF_4$. The wafer temperature was set to 100° C. The abscissa represents a $CF_4$ concentration in volume %, and the ordinate represents a delay time in second. The delay time r increases as the concentration increases. In the range from 2.5 volume % to 10 volume %, the delay time changes from about 1 second to about 10 seconds. A short delay time is preferable. From this viewpoint, a low $CF_4$ concentration is preferable.

From the experiment results shown in FIGS. 6 to 8 and FIG. 14, a high wafer temperature and a low $CF_4$ concentration are preferable in order to reduce the delay of the etching start of ashing a resist film with plasma exposure.

From the experiment results of the selectivity ratio shown in FIGS. 11 and 13, a low wafer temperature and a low $CF_4$ concentration are preferable in order to obtain a high selectivity ratio.

A high wafer temperature is preferable in order to shorten the delay time, whereas a low wafer temperature is preferable in order to raise a selectivity ratio. Although these conditions appear to be contradictory, there is a temperature range satisfying both the conditions. For example, in the characteristics shown in FIG. 11, a selectivity ratio almost sufficient for some practical use can be obtained in the substrate temperature range from about 50° C. to about 150° C. when the measurement results are extrapolated. The substrate temperature is desired to be in the range from about 50° C. to about 110° C. and more preferably from abut 50° C. to about 100° C. in order to obtain a more sufficient selectivity ratio.

A delay of an ashing start time poses no problem after the ashing starts once. The selectivity ratio is, however, a factor which affects the whole process from the ashing start to end.

If ashing (light etching) starts at a high temperature and thereafter the wafer temperature is lowered, a delay of an ashing start time can be shortened and a selectivity ratio can be maintained high. In this case, the upper limit of the wafer temperature may be set higher. However, at a wafer temperature of 200° C. or higher, heavy metals in resist may contaminate semiconductor and such a high temperature is often undesired. After ashing of a resist film starts once, it continues even if the wafer temperature is lowered to 25° C. or lower.

Embodiments of the invention will be described next.

Figure 1A:
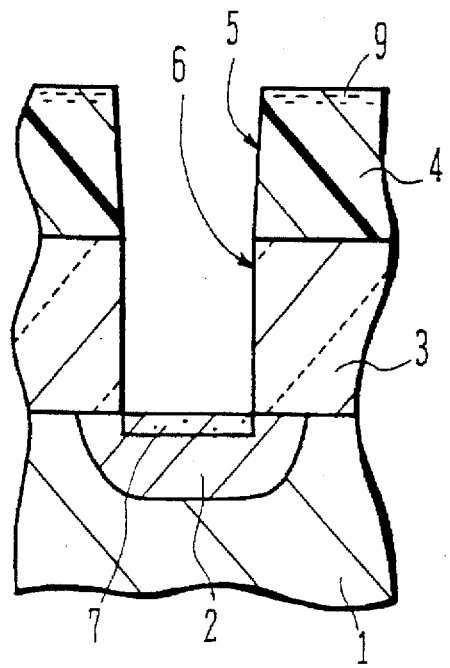
FIGS. 1A and 1B are schematic cross sectional views explaining a method of manufacturing a semiconductor device according to an embodiment of the invention.

Referring to FIG. 1A, on the surface of an Si substrate 1, a high impurity concentration region 2 is formed by ion implantation or other processes, to which region 2 an electrode is contacted. An $SiO_2$ insulating film 3 is deposited on the surface of the Si substrate 1 by chemical vapor deposition (CVD) or other processes. Other constituent elements such as an insulating gate of a MOSFET and a resistor region for a resistor element may be formed before the insulating film 3 is deposited. A resist pattern 4 is formed by usual photolithography on the insulating film 3. The resist pattern 4 has an opening 5 at the position corresponding to a contact hole to be next formed.

Figure 2:
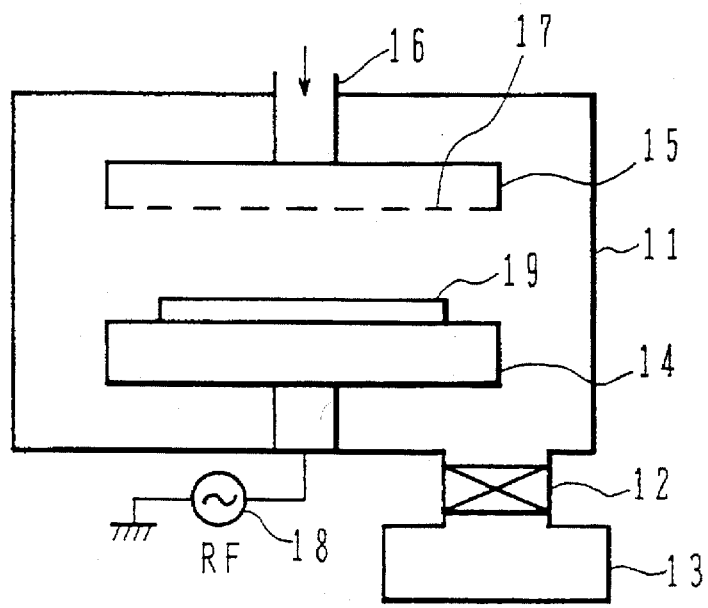
FIGS. 2 and 3 are schematic cross sectional views of plasma down-flow systems used by the embodiment manufacturing method of the invention.

The Si substrate 1 with the resist pattern 4 is transported into a parallel plate type RIE system shown in FIG. 2 to anisotropically etch the insulating film 3. Parallel plate electrodes 14f and 15 are disposed in a hermetic chamber 11 capable of being evacuated via a valve 12 by a gas exhauster 13.

A gas flow path connected to a gas pipe 16 is formed in the upper plate electrode 15. A punched metal board 17 is mounted on the bottom of the electrode 15. Gas supplied via the pipe 16 is flowed through the punched board 17 toward the lower electrode 14. The upper electrode 15 is being grounded.

The lower plate electrode 14 is connected to an RF power source 18. The RF power source 18 may be connected to the upper electrode 15 or to both the upper and lower electrodes. A subject 19 to be processed is placed on the lower plate electrode 14, gas is supplied via the pipe 16, the inside of the hermetic chamber 11 is set to a predetermined pressure by the exhauster 13, and an RF power is supplied from the RF power source 18 to start RIE.

RIE is performed under the following conditions assuming that the thickness of the insulating film 3 shown in FIG. 1A is 1 µm.

| CF$_4$ flow rate | 50 sccm |
|---|---|
| CHF$_3$ flow rate | 50 sccm |
| Pressure | 0.1 torr |
| RF power | 1.0 kW |
| Wafer temperature | 20° C. |
| Overetch | 30% |

A contact hole 6 is formed by RIE of the insulating film 3 under the above conditions. The surface of the Si substrate 1 exposed in the contact hole 6 is formed with a damaged layer because of RIE plasma exposure.

Figure 3:
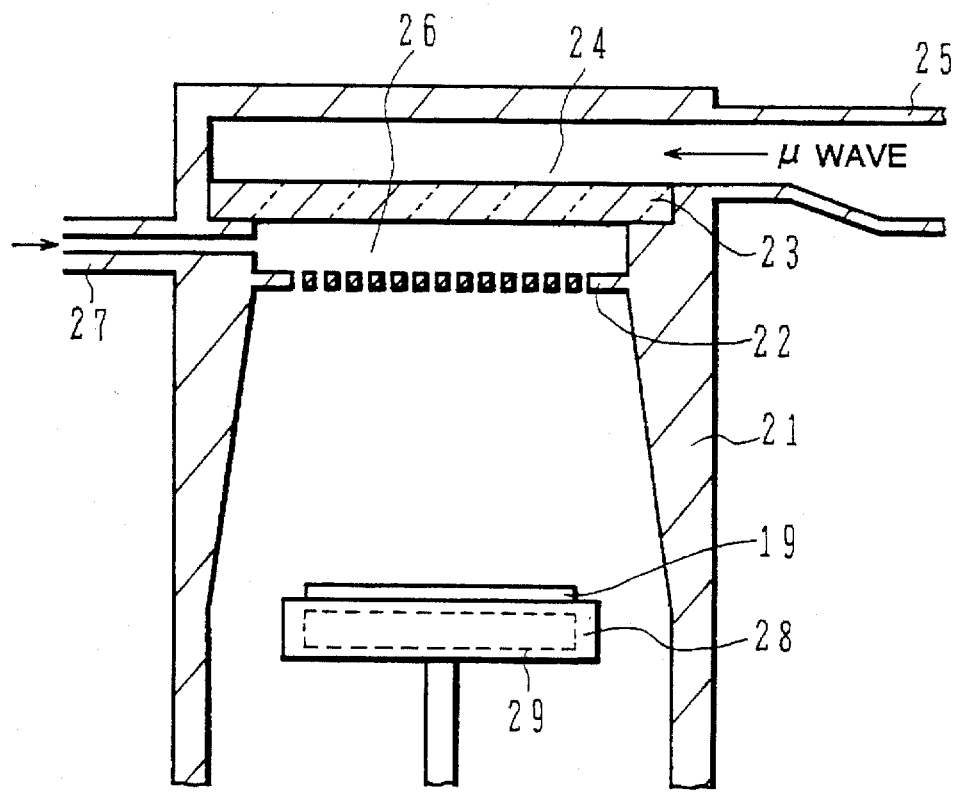

The wafer subjected to the RIE process shown in FIG. 1A is transported to a plasma down-flow system shown in FIG. 3 to perform both ashing and etching.

In FIG. 3, a chamber 21 communicates with a microwave guide room 24 via a window 23 made of alumina ceramic. Microwaves propagated in a microwave guide 25 is introduced via the microwave guide room 24 and window 23 into the chamber 21. Similar to the chamber shown in FIG. 3, the chamber 21 is connected via a valve to an exhauster so that the inside of the chamber can be evacuated to a desired vacuum degree.

A punched aluminum board 22 is mounted under the window 23 forming a plasma generating room 28 between the window 23 and board 22. The plasma generating room 26 communicates with a gas inlet pipe 27. Process gas is introduced via the gas inlet pipe 27 and microwaves are supplied so that plasma is generated in the plasma generating room 26.

A susceptor 28 with a temperature controller 29 is disposed under the punched board 22. A subject 19 to be processed is placed on the susceptor 28. The temperature controller 29 is constituted by a heater and a chiller, a temperature controlling device for flowing heat transfer medium at a desired temperature, or another device.

As gas is introduced via the gas pipe 27 and plasma is generated in the plasma generating room 26 at a desired pressure of the inside of the chamber 21, charged particles in plasma are confined in the upper space by the punched board 22 and only neutral particles including neutral active particles are conveyed through the punched board 22 onto the subject 19. In this manner, a dry process is performed by using mainly neutral active particles.

The Si substrate shown in FIG. 1A was transported into the chamber 21 shown in FIG. 8 and placed on the susceptor 28. A dry process for ashing/light etching was performed under the following conditions.

| O$_2$ flow rate | 950 sccm |
|---|---|
| CF$_4$ flow rate | 50 sccm |
| Pressure | 1.0 torr |
| Microwave power | 1.4 kW |
| Wafer temperature | 80° C. |

With this plasma down-flow process, a dry process proceeds by using O* radicals and F* radicals. Under the above conditions, the CF$_4$ concentration is 5 volume % and the wafer temperature is 80° C. It is therefore understood from the above-described experiment results that not only the fluorinated surface layer 9 on the surface of the resist film 4 can be ashed, but also the damaged layer 7 on the surface of the Si substrate 1 can be etched.

Figure 1B:
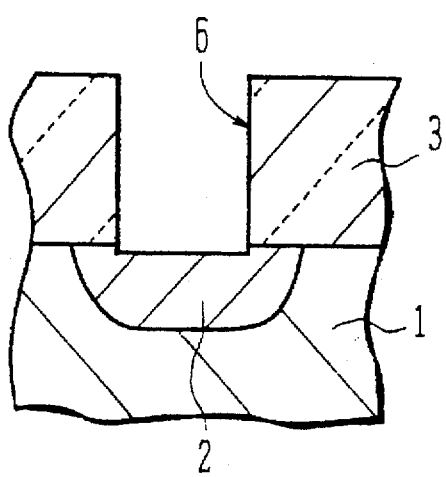

When the resist film 4 was completely peeled off, the etching amount of the surface of the Si substrate at the bottom of the contact hole 6 was about 10 nm or less. The damaged layer 7 on the surface of the Si substrate 1 is supposedly removed completely. The etching amount of the insulating film at the side wall of the contact hole was smaller than a measurement limit. The pattern precision of the contact hole 6 is supposedly maintained sufficiently. The cross section of the wafer after the plasma down-flow process is schematically shown in FIG. 1B.

According to this embodiment, after a resist pattern with an opening for a contact hole is formed, the contact hole with a surface damaged layer being removed can be formed by two dry processes.

Another embodiment of the invention will be described hereinunder. Similar to the already described embodiment, a contact hole such as shown in FIG. 1A was formed in an insulating film by RIE. Thereafter, the wafer was transported to the plasma down-flow system shown in FIG. 3 and a dry process for ashing/light etching was performed under the following conditions.

| O$_2$ flow rate | 975 sccm |
|---|---|
| CF$_4$ flow rate | 25 sccm |
| Pressure | 1.0 torr |
| Microwave power | 1.4 kW |
| Wafer temperature | 100° C. |

The CF$_4$ concentration was lowered to 2.5 volume % and the wafer temperature was raised to 100° C. When the resist film was completely peeled off by the dry process, the sample was picked up and the etching amount of the Si layer on the bottom of the contact hole 6 was measured. The etching amount was 5 nm. The etching amount of the insulating film at the side wall of the contact hole was smaller than a measurement limit. The etching amount of Si can be therefore controlled by changing the wafer temperature or the CF$_4$ concentration.

Similar to the already described embodiment, a sample with a contact hole such as shown in FIG. 1A was transported to the plasma down-flow system shown in FIG. 3, and a dry process by mixed gas of O$_2$+SF$_6$ as well as a dry process by mixed gas of O$_2$+NF$_3$ was performed. Also in these cases, the surface of the Si substrate at the bottom of the contact hole can be etched by a predetermined amount at the same time when ashing is completed, by controlling the concentration of fluorine containing gas to be 3 volume % or lower.

Since the dissociation factor of SF$_6$ is high, the concentration of SF$_6$ is required to be controlled in a very low concentration range. Since a process margin is narrow, a precise control is necessary.

The concentration of NF$_3$ is also required to be controlled in a very low concentration range, similar to SF$_6$. NF$_3$ is poisonous gas so that a waste gas process becomes necessary. When these points are taken into consideration, CF$_4$ is more suitable than SF$_6$ and NF$_3$ for semiconductor manufacturing.

In the embodiments described above, a constant wafer temperature is used. As described earlier, the wafer temperature may be set high at the initial stage of the ashing/light etching process, and thereafter set low.

B doped borosilicate glass (BSG), P doped phosphosilicate glass (PSG), and B and P doped borophosphosilicate glass (BPSG) may be used in addition to SiO$_2$ as the material of an interlayer insulating film.

The etching rates of these impurity doped materials such as BSG, PSG, and BPSG are not necessarily the same as $SiO_2$. In the following, use of BPSG will be described by way of example.

Figure 15A:
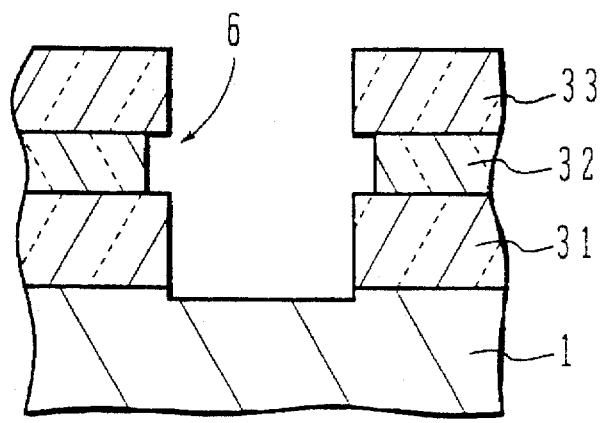
FIGS. 15A and 15B are a schematic cross sectional view and a graph, explaining the etching ratio of Si to $SiO_2$ and BPSG.

Referring to FIG. 15A, on the surface of an Si substrate, a laminate of an $SiO_2$ layer 31, a BPSG layer 32, and an $SiO_2$ layer 33 is being formed, and a contact hole 6 is being formed in this laminate. A photoresist pattern was formed on the three-layer interlayer insulating film $SiO_2$/BPSG/$SiO_2$ deposited on the Si substrate, and the contact hole 6 was formed in the interlayer insulating film. Ashing of the resist pattern and light etching of Si were performed at the same time and over-ashing was performed after the completion of ashing of the resist pattern, under the conditions of a substrate temperature of 80° C., an $O_2$ gas concentration of 95 volume %, and a $CF_4$ gas concentration of 5 volume %.

In the ashing/light etching process under the above conditions, the etching rate of BPSG is faster than that of $SiO_2$. Therefore, the side wall of the BPSG layer 32 is caved in more than those of the SiO2 layers 31 and 33, as shown in FIG. 15A.

If ashing of a thick resist pattern and light etching of an Si surface layer are performed for a long period of time after a contact hole is formed, a difference between the etching amounts of $SiO_2$ and BPSG layers becomes a practical issue. The problem is not only unevenness of the side wall of a contact hole but also broadening the contact hole. Such a problem is relieved the more the etching rates of $SiO_2$ and BPSG become lower than that of Si.

The temperature dependency of the etching rate ratios of Si to $SiO_2$ and BPSG was measured in order to raise the etching rate ratios.

Figure 15B:
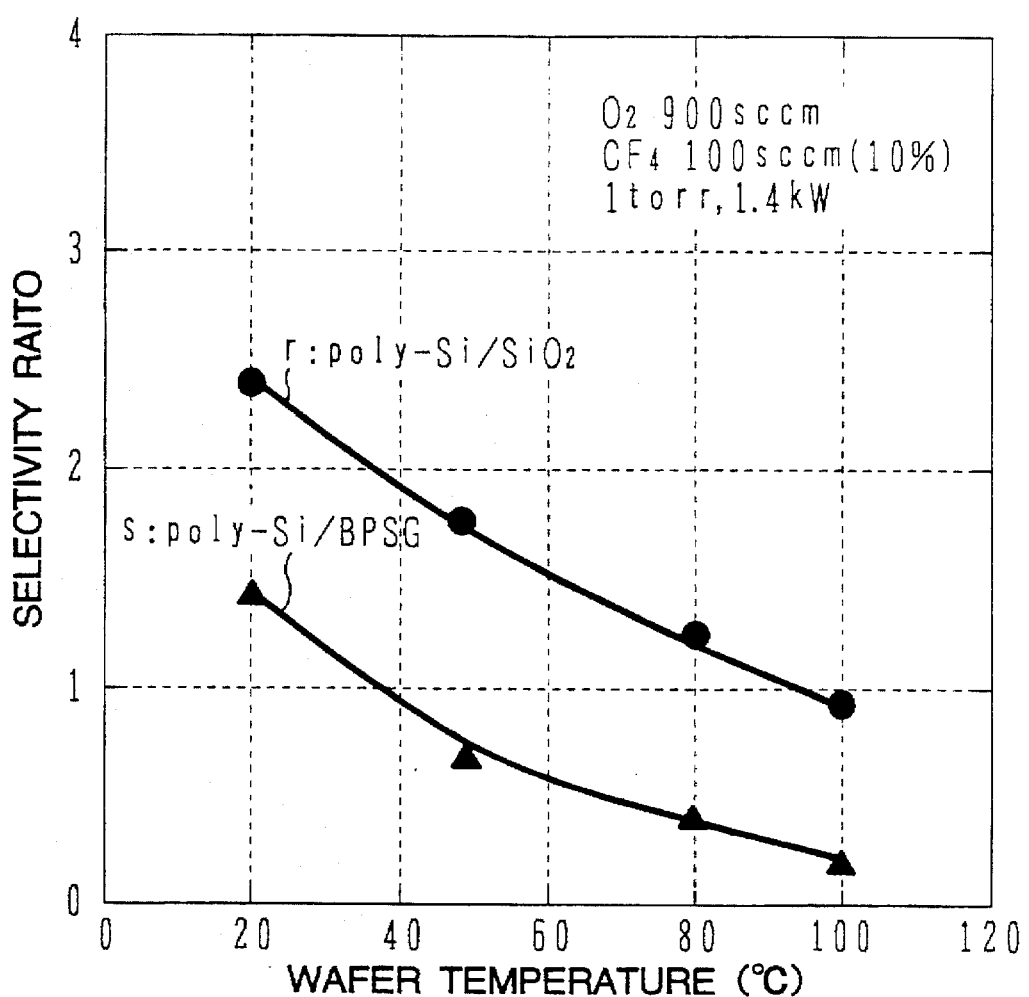

FIG. 15B is a graph showing the measurement results of the temperature dependency of the etching rate ratios of Si to $SiO_2$ and BPSG. The etching was performed under the conditions of an $O_2$ gas flow rate of 900 sccm, a $CF_4$ gas flow of 100 sccm, a pressure of 1 torr, and a microwave power of 1.4 kW. The abscissa represents a wafer temperature in °C., and the ordinate represents a selectivity ratio (etching rate ratio). Both the abscissa and ordinate are linear scales.

A curve r indicates the etching rate ratio of polycrystalline Si to $SiO_2$, and a curve s indicates the etching rate ratio of polycrystalline Si to BPSG. The curve s takes a value 1 (same etching rate) at 100° C. As the temperature is lowered, the etching rate ratio gradually rises and takes a value of about 2.3 at 20° C.

The curve s takes a value of about 0.2 at 100° C., which indicates that the etching rate of BPSG is several times as high as that of Si. As the temperature is lowered, the etching rate ratio gradually rises and takes a value of about 1.5 at 20° C.

It can be understood from the measurement results that the lower the temperature, the less the interlayer insulating film such as $SiO_2$ and BPSG is side-etched and the less the shape of the contact hole is affected by light etching of the Si surface layer. A fluorinated resist surface layer can't be removed, however, at 20° C.

In order to remove the fluorinated layer on the resist layer surface, it is preferable to ash the resist layer to a minimum necessary thickness at a temperature of 50° C. or higher and to thereafter perform ashing of the resist layer and light etching of the Si surface layer at the same time at a temperature of 30° C. or lower. With this process, the etching rate of the interlayer insulating film such as BPSG can be suppressed and the damaged layer on the Si surface can be removed.

Figure 16A:
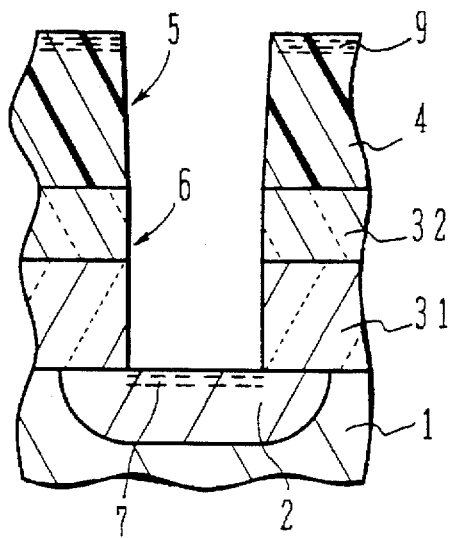
FIGS. 16A to 16C are schematic cross sectional views explaining a method of manufacturing a semiconductor device according to another embodiment of the invention.

Referring to FIG. 16A, on the surface of an Si substrate 1, an $SiO_2$ layer 31 having a thickness of about 500 nm and a BPSG layer 32 having a thickness of about 500 nm were deposited, and a resist layer 4 was coated on the BPSG layer 32. The resist layer 4 was selectively exposed to form an opening 5 at the area corresponding to a high impurity concentration region 2. By using the resist layer 4 with the opening 5 as an etching mask, the underlying BPSG layer 32 and $SiO_2$ layer 31 were etched under the following conditions by using the parallel plate type RIE system shown in FIG. 2.

| | |
|---|---|
| $CF_4$ flow rate | 50 sccm |
| $CHF_3$ flow rate | 50 sccm |
| Pressure | 0.1 torr |
| RF power | 1.0 kW |
| Chiller temperature | 20° C. |
| Overetch | 30% |

The Si substrate was placed on the susceptor with a chiller (cooler), the Si substrate in tight contact with the susceptor being cooled to the chiller temperature.

By an etching process under the above conditions, a contact hole 6 was formed in the BPSG layer 32 and $SiO_2$ layer 31. A damaged layer 7 was formed by plasma exposure on the surface of the high impurity concentration region 2. The structure shown in FIG. 16A is the same as FIG. 1A excepting that the insulating layer is a laminate of the BPSG layer 32 and $SiO_2$ layer 31.

Figure 17B:
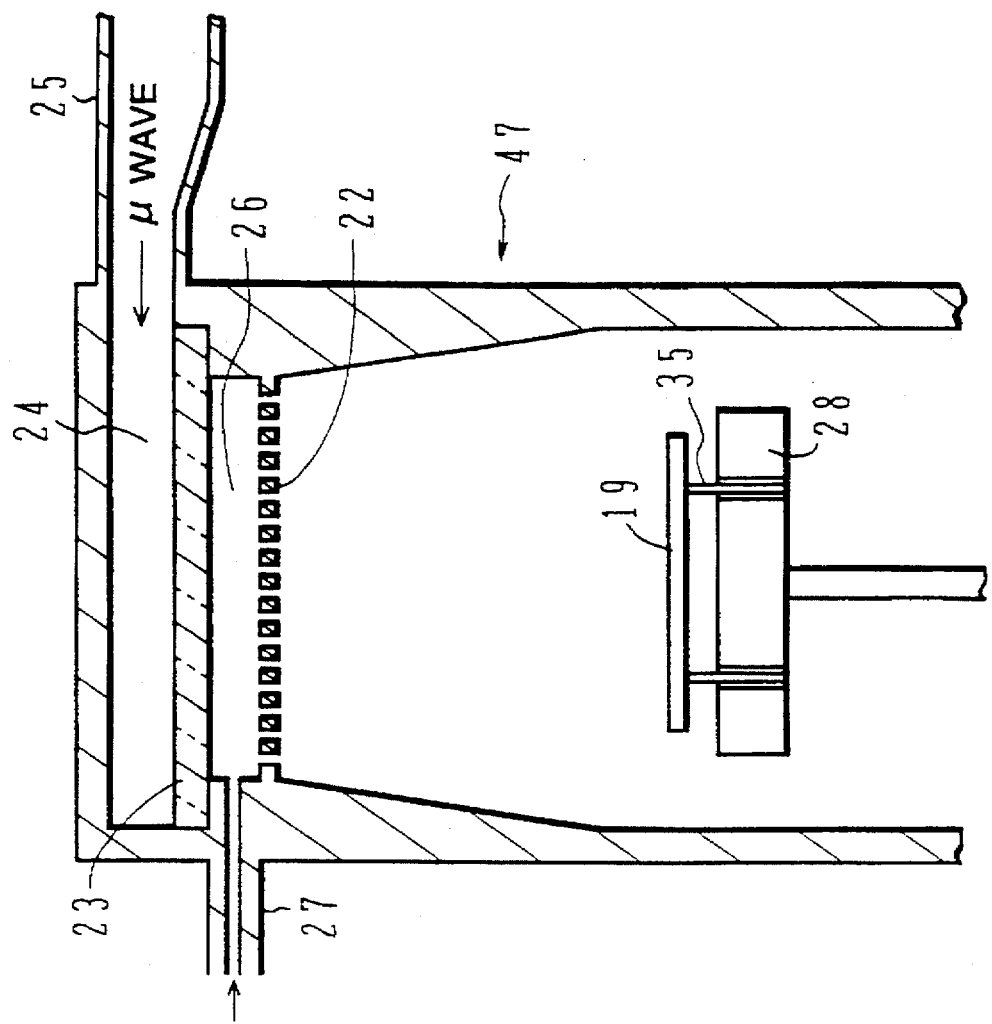
FIGS. 17A and 17B are a schematic plan view and a schematic cross sectional view of a vapor phase process system used by the embodiment manufacturing method of the invention.
Figure 17A:
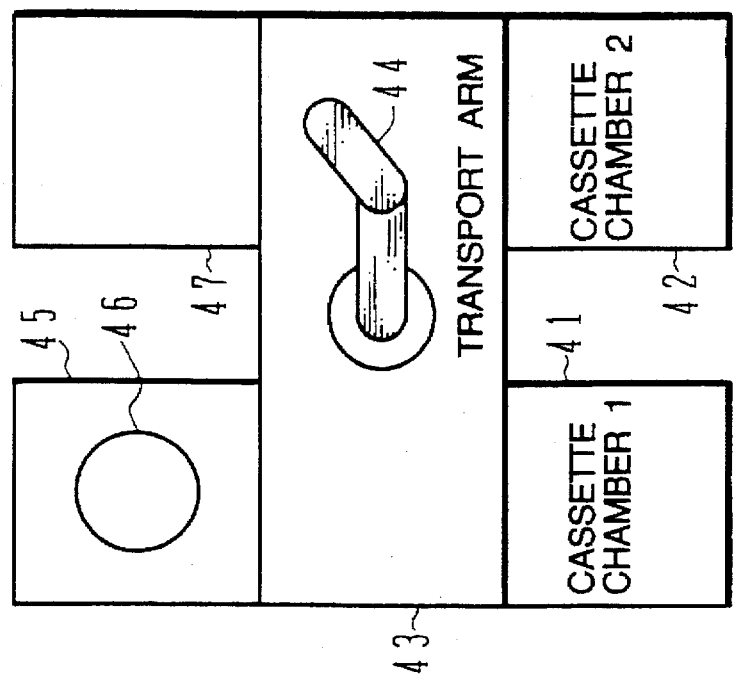
Figure 18A:
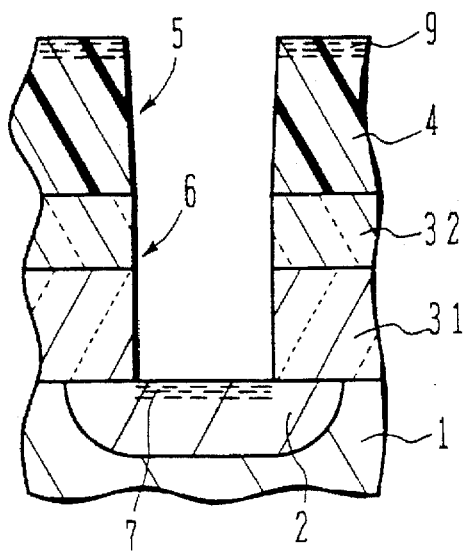
FIGS. 18A to 18C are schematic cross sectional views explaining a method of manufacturing a semiconductor device according to still another embodiment of the invention.
Figure 18B:
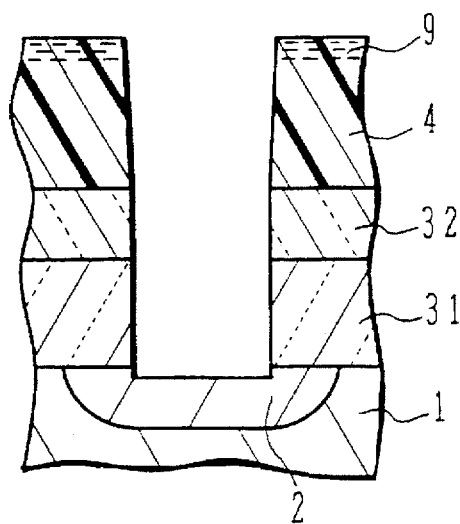
Figure 18C:
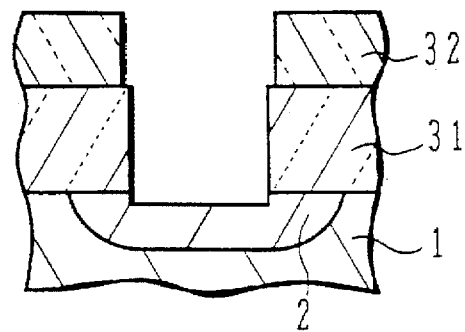

The sample shown in FIG. 16A was subjected to a dry process of ashing/light etching while it is heated and thereafter cooled, by using a dry etching system such as shown in FIGS. 17A and 17B.

FIG. 17A schematically shows the overall structure of the dry etching system. Wafer cassettes can be accommodated in cassette chambers 41 and 42 which can be made accessible to a transport chamber 43 via gate valves. A transport arm 44 is mounted for the access to the inside of the transport chamber 43.

The transport chamber is made accessible to a heating room 45 and a down-flow process room 47 via gate valves. A heating stage 46 is mounted in the heating room 45, and a wafer can be placed on the heating stage 46 to heat it. The down-flow process room 47 has the structure such as shown in FIG. 17B.

The down-flow process system shown in FIG. 17B has the structure generally the same as the down-flow process system shown in FIG. 3. However, the down-flow process system shown in FIG. 17B has a temperature controlled susceptor 28 with a chiller so that a subject 19 to be processed can be cooled. The susceptor 28 also has lift pins 38 allowing the subject 19 to be held in a suspended state shown in FIG. 17B. When the lift pins 35 are moved downward, the subject 19 is made in tight contact with the susceptor 28 and is cooled by the chiller. The other structures are similar to the down-flow process system shown in FIG. 3.

The process system shown in FIG. 17 can heat a subject at the heating stage 46, can maintain the subject in the heated state by holding it up by the lift pins, and can cool it to a desired temperature by the chiller by moving it downward by the lift pins.

The sample shown in FIG. 16A was placed on the heating stage 46 shown in FIG. 17B to heat it to 100° C. Thereafter, the sample was transported to the down-flow process system 47 and placed on the raised lift pins 35. The sample in a heated state can be subjected to a vapor phase process.

The fluorinated layer 9 of this sample was removed under the following conditions.

| | |
|---|---|
| O₂ flow rate | 950 sccm |
| CF₄ flow rate | 50 sccm |
| Pressure | 1.0 torr |
| Microwave power | 1.4 kW |
| Wafer temperature | 80° C. |
| Process time | 6 sec |

During the vapor phase process, the lift pins 35 were maintained to be upward to enable thermal insulation between the wafer and the susceptor 28. As a result, the wafer was hardly cooled and was maintained at the temperature of 80° C. In this state, the fluorinated layer on the resist film surface was removed.

Figure 16B:
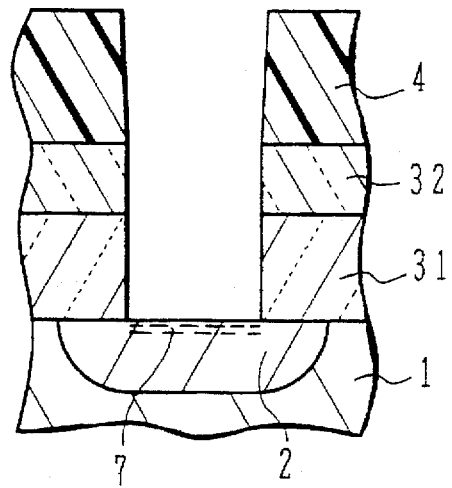

FIG. 16B shows the sample with the fluorinated layer 9 on the resist film surface being removed. Although the fluorinated layer 9 on the surface of the resist layer 7 was removed, the damaged layer 7 on the surface of the high impurity concentration region 2 was removed only slightly and the BPSG layer 32 and SiO₂ layer were scarcely affected.

Next, the lift pins 35 were moved downward to make the sample shown in FIG. 16B in tight contact with the susceptor to cool it by the chiller. Because of thermal contact between the susceptor and wafer, the wafer temperature was gradually lowered. The process as suspended until the wafer temperature is lowered to 30° C. or lower, and a dry process of ashing/light etching was further processed under the following conditions.

| | |
|---|---|
| O₂ flow rate | 900 sccm |
| CF₄ flow rate | 100 sccm |
| Pressure | 1.0 torr |
| Microwave power | 1.4 kW |
| Wafer temperature | 25° C. |

A vapor process was conducted under the above conditions. When the damaged layer on the surface of the Si substrate 1 was removed by 10 nm, the topology of the sample was checked.

Figure 16C:
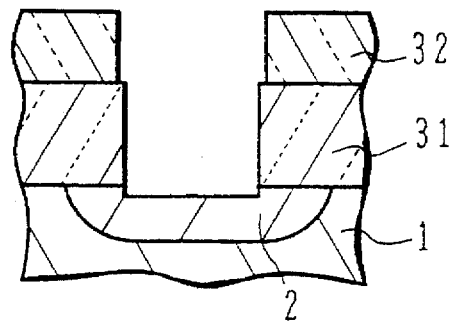

FIG. 16C schematically shows the topology of the sample after the ashing/light etching process. A retract of the SiO₂ layer 31 at the side wall was not observed, and it was found that the broadened hole diameter in the BPSG layer 32 was about 30 nm. Since the damaged layer had a thickness of about several nm, it was nearly completely removed under the conditions capable of removing the damaged layer by 10 nm.

If the above-described two-step process is not performed but a vapor phase process is performed under the same conditions of the vapor phase process of removing the fluorinated layer and under the conditions capable of removing the damaged layer by 10 nm, the broadened hole diameter in the BPSG layer 32 was about 60 nm. By dividing the process into two steps and by performing the latter step in a cooled state, the broadened hole diameter in the BPSG layer 32 was approximately halved.

In this embodiment, after the sample was heated on the heating stage 46 shown in FIG. 17A, it was subjected to the vapor phase process consecutively between two steps in the down-flow process system 47. The two steps may be performed in different chambers. It is however obvious that using the same chamber requires less cost and time than using two different chambers.

In this embodiment, the wafer was heated on the heating stage to raise the wafer temperature. The wafer may be heated on the transport arm in the transport chamber, or with a heating lamp provided in the transport chamber or in the down-flow process system.

The susceptor 28 may be an electrostatic attraction susceptor. In this case, tight contact between the wafer and susceptor is improved and it takes a shorter time to cool the wafer. It takes about 20 seconds to cool the wafer to 30° C. or lower after the lift pins are moved down, whereas it takes about 10 seconds to cool the wafer to 30° C. or lower by using the electrostatic attraction susceptor.

In the above embodiment, mixed gas of O₂+CF₄ was used for both removal of the fluorinated layer and ashing/light etching of the resist layer and Si surface layer. In this case, the Si surface layer is etched also in the fluorinated layer removing process. It is preferable in some cases to remove only the fluorinated layer on the resist surface without substantially etching the Si surface layer.

In the following, use of mixed gas of O₂+H₂O for the fluorinated layer removal will be described. A sample like the embodiment described above was formed and a contact hole shown in FIG. 16A was formed under the following conditions.

| | |
|---|---|
| CF₄ flow rate | 50 sccm |
| CHF₃ flow rate | 50 sccm |
| Pressure | 0.1 torr |
| RF power | 1.0 kW |
| Chiller temperature | 20° C. |
| Overetch | 25% |

The above conditions are the same as the embodiment described with reference to FIGS. 16A to 16C excepting that the overetch is 25%.

Similar to the previously described embodiment, the sample was thereafter transported to the vapor phase process system shown in FIGS. 17A and 17B and heated to 130° C. on the heating stage 46. The heated wafer was placed on the raised lift pins. In this state, a vapor phase process was performed under the following conditions.

| | |
|---|---|
| O₂ flow rate | 900 sccm |
| H₂O flow rate | 100 sccm |
| Pressure | 1.0 torr |
| Microwave power | 1.4 kW |
| Wafer temperature | 100° C. |
| Process time | 20 sec |

This fluorinated layer removal process used H₂O gas instead of CF₄ gas so that the Si surface layer was not etched. The wafer temperature was raised and the process time was prolonged, more than the previously described embodiment. During this process, the lift pins are maintained upward and heat insulation between the wafer and susceptor is enabled. Therefore, the wafer is hardly cooled and takes the wafer temperature of 100° C. In this state, the fluorinated layer on the surface of the resist layer was removed.

After the fluorinated layer on the resist layer surface was removed, the lift pins were moved downward to disable heat insulation between the wafer and susceptor, and the process was suspended until the wafer is cooled to 30° C. or lower. Thereafter, the wafer was processed under the following conditions.

| | |
|---|---|
| O₂ flow rate | 900 sccm |
| CF₄ flow rate | 100 sccm |
| Pressure | 1.0 torr |
| Microwave power | 1.4 kW |
| Wafer temperature | 20° C. |

The wafer temperature was set lower by 5° C. than the previously described embodiment.

When the damaged layer on the Si surface was removed by 10 nm, it was found that a retract of the SiO₂ layer 31 at the side wall of the contact hole was hardly observed and the broadened hole diameter in the BPSG layer 32 was 30 nm.

It took 25 seconds or less to cool the wafer to 30° C. or lower after the fluorinated layer on the resist layer surface of the wafer heated to 100° C. was removed and the lift pins were moved downward. If an electrostatic attraction susceptor is used and the same conditions are applied, it takes 15 seconds to cool the wafer to 30° C. or lower.

It is understood that this embodiment provides generally the same advantages of the previously described embodiment.

Gas which can remove a fluorinated layer on the resist layer surface without substantially etching Si is not limited to only O₂+H₂O.

Use of O₂+N₂ in place of mixed gas of O₂+H₂O for removing a fluorinated layer on the resist layer surface will be described hereinunder. A fluorinated layer on the surface of a resist layer was removed under the following conditions.

| | |
|---|---|
| O₂ flow rate | 900 sccm |
| N₂ flow rate | 100 sccm |
| Pressure | 1.0 torr |
| Microwave power | 1.4 kW |
| Wafer temperature | 100° C. |
| Process time | 30 sec |

As compared to the previously described embodiment, N₂ was used in place of H₂O and the process time was prolonged from 20 seconds to 30 seconds.

After the fluorinated layer on the resist layer surface was removed under the above conditions, the lift pins were moved downward to disable heat insulation between the wafer and susceptor, the process was suspended until the wafer was cooled to 30° C. or lower with the chiller, and the following ashing/light etching was performed under the same conditions as the previous embodiment.

It was found from the results of these processes that when the Si surface layer of the sample was removed by 10 nm, a retract of the SiO₂ layer 31 at the side wall of the contact hole was rarely observed and the broadened hole diameter in the BPSG layer 32 was 30 nm.

As described above, O₂+H₂O or O₂+N₂ mixed gas can be used for removing a fluorinated layer on the surface of a resist layer without substantially etching an Si surface layer.

In the above two embodiments, the wafer was first heated and then cooled to first remove the fluorinated layer on the resist layer surface and then remove the Si surface layer while ashing the resist layer.

The order of removing the Si surface layer and fluorinated surface layer may be interchanged. In this case, it is convenient to use lift pins and a susceptor equipped with a heater.

A sample similar to that used by the two-step process embodiment was formed. Then, a contact hole was formed in the interlayer insulating film under the conditions similar to the two-step process embodiment using O₂+H₂O for removing the fluorinated layer.

After the contact hole was formed, the sample transported to the down-flow process system shown in FIGS. 17A and 17B and placed on the raised lift pins. The Si surface layer was first removed under the following conditions. It is assumed here that the susceptor is equipped with a heater.

| | |
|---|---|
| O₂ flow rate | 900 sccm |
| CF₄ flow rate | 100 sccm |
| Pressure | 1.0 torr |
| Microwave power | 1.4 kW |
| Wafer temperature | 20° C. |
| Etching time | 30 sec |

In this process, the wafer temperature was maintained to be 20° C. so that the fluorinated layer on the resist layer surface could not be removed although the Si surface layer was removed.

Next, the lift pins were moved upward, the wafer was heated with the heater to 180° C., and the ashing process for removing the resist layer was performed under the following conditions.

| | |
|---|---|
| O₂ flow rate | 900 sccm |
| H₂O flow rate | 100 sccm |
| Pressure | 1.0 torr |
| Microwave power | 1.4 kW |
| Wafer temperature | 180° C. |
| Process time | 30 sec |

The gas O₂+H₂O used by this resist ashing process etches none of Si, SiO₂, and BPSG.

The two-step process described just above could remove the silicon surface layer and could ash the resist layer. It was found that when the Si damaged layer was removed by 10 nm, a retract of the SiO₂ layer at the side wall of the contact hole was rarely observed and the broadened hole diameter in the BPSG layer 32 was 20 nm.

Also with this process, it was possible to ash the resist layer and remove the Si surface layer by changing the temperature of the inside of the single chamber. In the case of this embodiment, it is also possible to provide a heating lamp in the chamber to heat the wafer raised by the lift pins or to place the wafer heated outside of the chamber on the lift pins. Also in such a case, generally the same results are supposed to be obtained if the same wafer temperatures and vapor phase process conditions are used.

In the above embodiments, O₂+CF₄ mixed gas is used in the vapor phase process for performing etching of the Si surface layer and ashing of the fluorinated layer at the same time. Other gases such as O₂+SF₆ and O₂+NF₃ may also be used. The first and second steps may be performed respectively at a high temperature and a low temperature, or vice versa.

As described so far, both a damaged layer on a semiconductor surface and a resist film can be removed by a single process or by continuous processes.

The present invention has been described in connection with the preferred embodiments. The invention is not limited only to the above embodiments. It is apparent to those skilled in the art that various modifications, improvements, combinations, and the like can be made without departing from the scope of the appended claims.

We claim:

1. A method of manufacturing a semiconductor device comprising the steps of:

forming an insulating film on a silicon substrate;

forming a resist pattern on said insulating film;

etching said insulating film with fluorocarbon containing gas by using said resist pattern as an etching mask to expose a surface of said silicon substrate; and performing an ashing and etching process in a single down-flow process chamber with a gas containing $O_2$ and $CF_4$, while heating said silicon substrate to about 40° C. or higher at least at an initial period of said ashing and etching process for ashing said resist pattern and etching a surface layer at said exposed surface of said silicon substrate at the same time.

2. A method according to claim 1, wherein said heating includes heating said silicon substrate in the temperature range from 50° to 200° C.

3. A method according to claim 2, wherein said heating includes heating said silicon substrate in the temperature range from 50° to 100° C.

4. A method according to claim 1, wherein a flow ratio of a flow rate of said $CF_4$ to a flow rate of $CF_4+O_2$ is about 1 to 8 volume %.

5. A method according to claim 4, wherein said flow ratio is about 2.5 to 5 volume %.

6. A method according to claim 1, wherein said ashing and etching process includes lowering a temperature of said silicon substrate after said heating.

7. A method according to claim 6, wherein said ashing/etching process includes a process of ashing mainly a fluorinated layer of said resist pattern at a substrate temperature of about 50° C. or higher and a process of ashing said resist pattern and etching said surface layer at said exposure surface of said silicon substrate at the same time by lowering said substrate temperature to about 30° C. or lower after said fluorinated layer was ashed.

8. A method according to claim 1, Wherein said ashing and etching process is performed by using an electrostatic attraction susceptor.

9. A method of manufacturing a semiconductor device comprising the steps of:

(a) forming an insulating film on a silicon substrate;

(b) coating a resist film on said insulating film, exposing and developing said resist film to form a resist pattern;

(c) etching said insulating film with fluorocarbon containing gas by using said resist pattern as a mask to form a contact hole;

(d) raising a substrate temperature to 50° C. or higher and ashing said resist pattern with a gas containing $O_2$ and $CF_4$ in a single down-flow process chamber; and (e) thereafter lowering said substrate temperature to 30° C. or lower in said process chamber and performing ashing of said resist pattern and etching of a silicon surface layer at a bottom of said contact hole at the same time with the gas containing $O_2$ and $CF_4$.

10. A method according to claim 9, wherein said step (d) is performed by setting a flow ratio of $CF_4$ to a total gas to 5 volume % or less.

11. A method according to claim 9, wherein said step (d) is performed by heating said silicon substrate at an outside of said down-flow process chamber and thereafter transporting said silicon substrate into said down-flow process chamber.

12. A method according to claim 9, wherein said step (d) is performed by heating said silicon substrate with a lamp.

13. A method according to claim 9, wherein said steps (d) and (e) are performed by using a susceptor having a cooling stage and lift means for lifting a subject to be processed from said cooling stage, said step (d) is performed by lifting said silicon substrate by said lift means, and said step (e) is performed by thermally contacting said silicon substrate with said cooling stage.

14. A method according to claim 9, wherein said steps (d) and (e) are performed by using an electrostatic attraction susceptor.

15. A method of manufacturing a semiconductor device comprising the steps of:

(a) forming an insulating film on a silicon substrate;

(b) coating a resist film on said insulating film, exposing and developing said resist film to form a resist pattern;

(c) etching said insulating film with fluorocarbon containing gas by using said resist pattern as a mask to form a contact hole;

(f) etching a silicon surface layer at the bottom of said contact hole with a gas containing $O_2$ and $CF_4$ in a down-flow process chamber while maintaining a silicon substrate temperature at 30° C. or lower; and (g) thereafter raising said silicon substrate temperature to 50° C. or higher and ashing said resist pattern in the same process chamber.

16. A method according to claim 15, wherein said step (g) is performed by raising said silicon substrate temperature to 150° C. or higher.

17. A method according to claim 15, wherein said step (g) is performed by using gas containing $O_2$ and $H_2O$ or gas containing $O_2$ and $N_2$.

18. A method according to claim 15, wherein said step (g) is performed by heating said silicon substrate with a lamp.

19. A method according to claim 15, wherein said steps (f) and (g) are performed by using a susceptor having a cooling stage and lift means for lifting a subject to be processed from said cooling stage, said step (f) is performed by thermally contacting said silicon substrate with said cooling stage, and said step (g) is performed by lifting said silicon substrate by said lift means and heating said silicon substrate.

20. A method according to claim 15, wherein said steps (f) and (g) are performed by using a susceptor having a heating stage and lift means for lifting a subject to be processed from said heating stage, said step (f) is performed by lifting said silicon substrate by said lift means, and said step (g) is performed by lowering said silicon substrate by said lift means and thermally contacting said silicon substrate with said heating stage.

21. A method according to claim 15, wherein said steps (f) and (g) are performed by using an electrostatic-attraction susceptor.

* * * * *